(12) United States Patent
Morita et al.

(10) Patent No.: US 11,094,572 B2
(45) Date of Patent: Aug. 17, 2021

(54) SUBSTRATE PROCESSING APPARATUS AND RECORDING MEDIUM

(71) Applicant: KOKUSAI ELECTRIC CORPORATION, Tokyo (JP)

(72) Inventors: Osamu Morita, Toyama (JP); Yuji Yamaoka, Toyama (JP); Shuichi Kubo, Toyama (JP); Toshiro Koshimaki, Toyama (JP); Hiroyuki Kitamoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 294 days.

(21) Appl. No.: 16/225,671

(22) Filed: Dec. 19, 2018

(65) Prior Publication Data

US 2019/0189490 A1 Jun. 20, 2019

(30) Foreign Application Priority Data

Dec. 20, 2017 (JP) .............................. JP2017-243741
Dec. 7, 2018 (JP) .............................. JP2018-229665

(51) Int. Cl.
*G06F 7/00* (2006.01)
*H01L 21/677* (2006.01)
(Continued)

(52) U.S. Cl.
CPC .. *H01L 21/67781* (2013.01); *H01L 21/67109* (2013.01); *H01L 21/67248* (2013.01);
(Continued)

(58) Field of Classification Search
CPC ......... H01L 21/67781; H01L 21/67248; H01L 21/67109; H01L 21/67769;
(Continued)

(56) References Cited

U.S. PATENT DOCUMENTS 5,464,313 A    11/1995  Ohsawa
2004/0238519 A1  12/2004  Sakamoto et al.
(Continued)

FOREIGN PATENT DOCUMENTS

JP     06-236854 A    8/1994
JP     2001-102427 A  4/2001
(Continued)

OTHER PUBLICATIONS

Japanese Office Action dated Feb. 25, 2020 for the Japanese Patent Application No. 2018-229665.
(Continued)

*Primary Examiner* — Yolanda R Cumbess
(74) *Attorney, Agent, or Firm* — Volpe Koenig

(57) ABSTRACT

There is provided an apparatus including a substrate holder to hold substrates including a product substrate and a dummy substrate, a transfer mechanism that loads the substrates into the substrate holder, a storage part to store a device parameter including at least the number of substrates that can be loaded on the substrate holder and the number of product substrates to be loaded on the substrate holder, and a controller to: (1) create substrate transfer data, which includes information indicating an order for transferring the substrates, transfer source information, and transfer destination information, according to the device parameter, (2) read the created substrate transfer data, (3) by transferring the substrates to the transfer mechanism based on the read substrate transfer data, transfer the dummy substrate to a substrate holding region except for a heat equalization region, and transfer the product substrate to the heat equalization region on the substrate holder.

13 Claims, 17 Drawing Sheets

(51) Int. Cl.
*H01L 21/673* (2006.01)
*H01L 21/67* (2006.01)
*H01L 21/687* (2006.01)

(52) U.S. Cl.
CPC .. *H01L 21/67253* (2013.01); *H01L 21/67276* (2013.01); *H01L 21/67309* (2013.01); *H01L 21/67393* (2013.01); *H01L 21/67754* (2013.01); *H01L 21/67757* (2013.01); *H01L 21/67769* (2013.01); *H01L 21/68771* (2013.01)

(58) Field of Classification Search
CPC ......... H01L 21/67309; H01L 21/67253; H01L 21/67757; H01L 21/67393; H01L 21/68771; H01L 21/67754; H01L 21/67276
See application file for complete search history.

(56) References Cited

U.S. PATENT DOCUMENTS

| | | | |
|---|---|---|---|
| 2013/0102159 A1 | 4/2013 | Kotani et al. | |
| 2013/0178954 A1 | 7/2013 | Mizuguchi | |
| 2013/0253689 A1 | 9/2013 | Yoneda et al. | |
| 2014/0017822 A1* | 1/2014 | Sakai | H01L 21/4825 438/15 |
| 2015/0050815 A1* | 2/2015 | Yanagisawa | H01J 37/32889 438/778 |
| 2015/0144621 A1* | 5/2015 | Hong | H01L 21/67115 219/709 |
| 2015/0259799 A1 | 9/2015 | Motoyama et al. | |
| 2015/0267293 A1 | 9/2015 | Motoyama et al. | |
| 2015/0371883 A1* | 12/2015 | Takahashi | H01L 21/68771 438/5 |
| 2015/0376789 A1 | 12/2015 | Motoyama et al. | |

FOREIGN PATENT DOCUMENTS

| | | |
|---|---|---|
| JP | 2002-141391 A | 5/2002 |
| JP | 2002-246432 A | 8/2002 |
| JP | 2003-051497 A | 2/2003 |
| JP | 2003-110002 A | 4/2003 |
| JP | 2008-135517 A | 6/2008 |
| JP | 2009-231748 A | 10/2009 |
| JP | 2013-102125 A | 5/2013 |
| JP | 2013-140897 A | 7/2013 |
| KR | 10-0233310 B1 | 12/1999 |
| KR | 10-2013-0080756 A | 7/2013 |
| TW | 200413995 A | 8/2004 |
| TW | 201351533 A | 12/2013 |
| TW | 201604312 A | 2/2016 |
| TW | 201604964 A | 2/2016 |

OTHER PUBLICATIONS

Korean Office Action dated Jul. 20, 2020 for Korean Patent Application No. 10-2018-0165290.

Taiwanese Office Action dated Mar. 3, 2020 for the Taiwanese Patent Application No. 107145120.

Japanese Office Action dated Mar. 23, 2021 for Japanese Patent Application No. 2020-076166.

* cited by examiner

| Maintenance item | Maintenance No. |
|---|---|
| PM1 < = > PM2 | 00 |
| PM1 | 01 |
| PM2 | 02 |
| Number of Resident uses of Dummy wafer | 35 |
| Number of Recipe execution | 10 |
| Recipe film thickness value | 13 |
| Number of Recipe step execution | 39 |

FIG. 6B

| Group name | User name | Password | Used Reactor |
|---|---|---|---|
| Product | Ichiro | * | PM1 |
| Product | Jiro | * | PM2 |
| Product | Hanako | * | ALL |

FIG. 6C

|  | PM1 | PM2 |
|---|---|---|
| SD | DA | DB |
| M1 |  |  |
| PD |  |  |
| FD | DA | DB |
| R1 |  |  |
| M2 |  |  |
| R2 |  |  |

FIG. 6D

| | Different film types | | The same film type | |
|---|---|---|---|---|
| | There is not device automatic determination | There is device automatic determination | There is not device automatic determination | There is device automatic determination |
| Screen injection | Determination as login user | Determination as login user | AUTO setting | AUTO setting |
| HOST injection | Designate one of PM1/PM2/AUTO | Perform device automatic determining process | AUTO setting | Perform device automatic determining process |

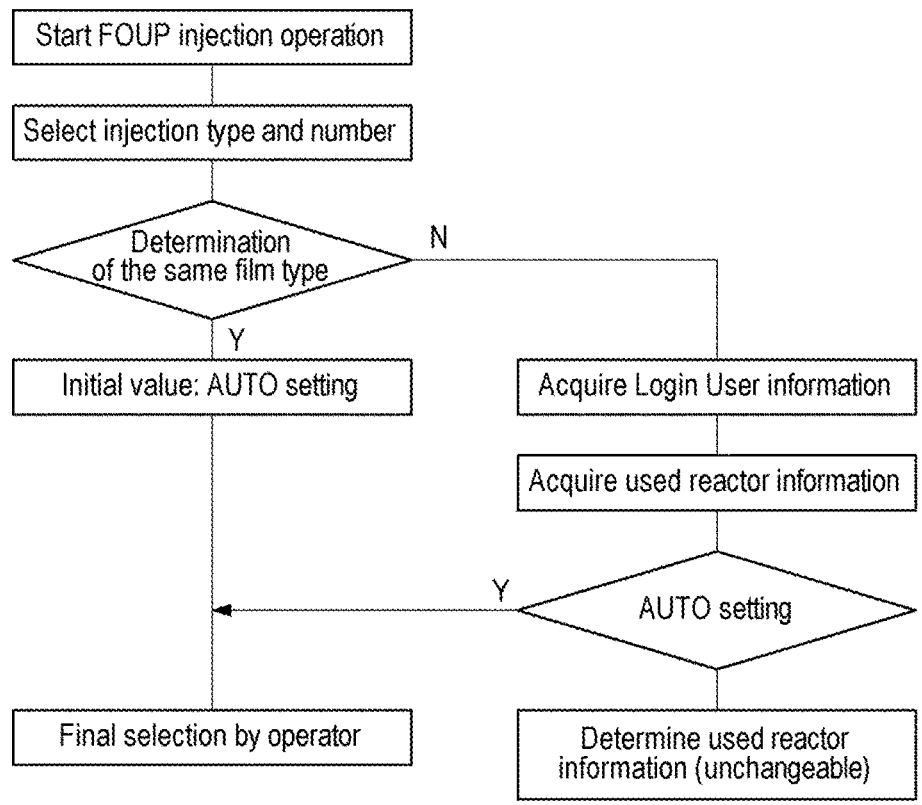

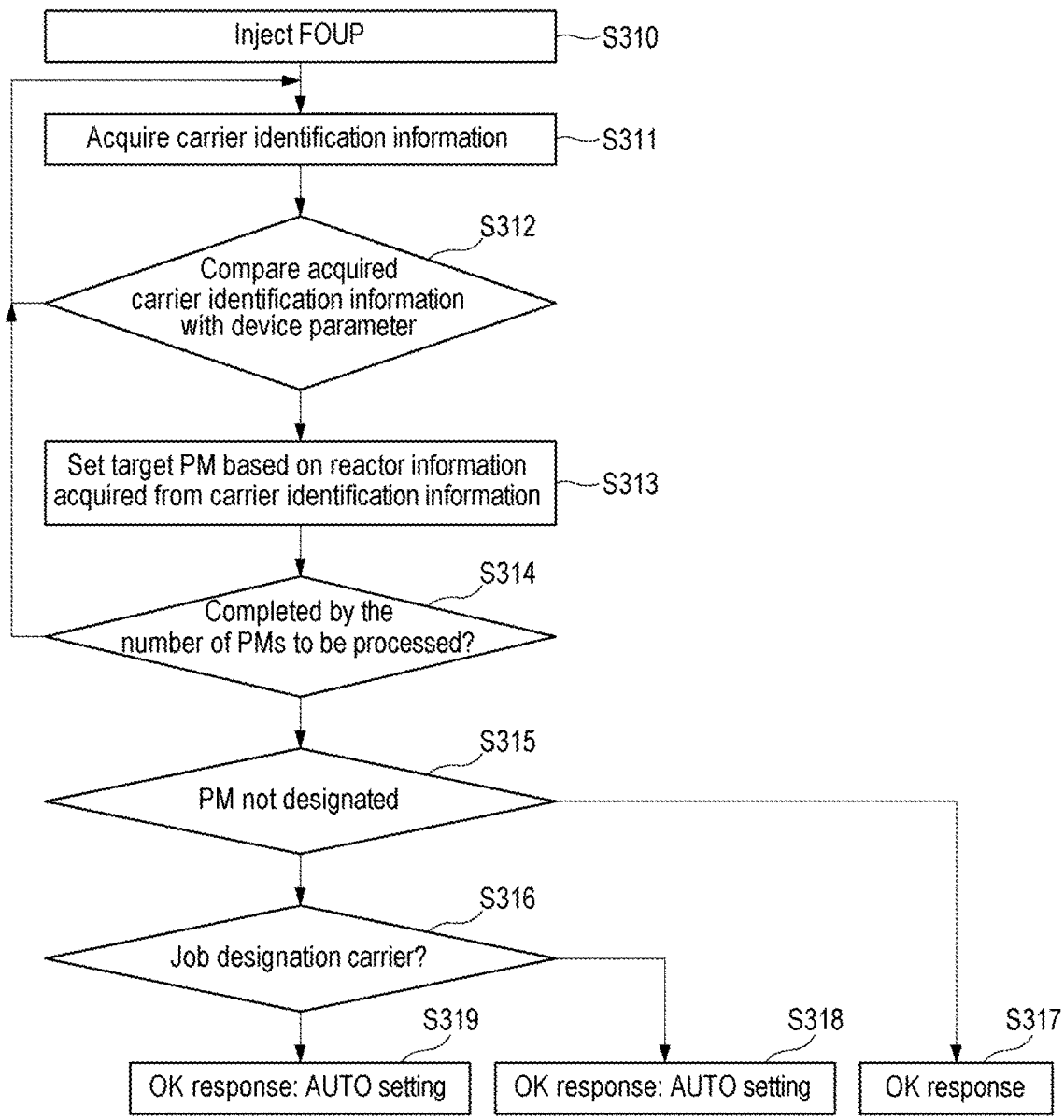

FIG. 12A

| Boat Slot | Transfer priority | P# | FOUP Slot | Used process module |
|---|---|---|---|---|
| 46 | 01 | D01 | 01 | PM1 |
| 45 | 02 | | 02 | |
| 44 | 44 | M01 | 01 | |
| 43 | 06 | P01 | 01 | |
| ⋮ | ⋮ | | ⋮ | |
| 25 | 24 | | 19 | |
| 24 | 45 | M01 | 02 | |
| 23 | 25 | P01 | 20 | |
| ⋮ | ⋮ | | ⋮ | |
| 18 | 30 | | 25 | |
| 17 | 31 | P02 | 01 | |
| ⋮ | ⋮ | | ⋮ | |
| 5 | 43 | | 13 | |
| 4 | 46 | M01 | 03 | |
| 3 | 03 | D01 | 03 | |
| 2 | 04 | | 04 | |
| 1 | 05 | | 05 | |

| Priority | P# | Slot | Used process module |
|---|---|---|---|
| 01 | P01 | 01 | PM1 |
| : | | : | |
| 25 | | 25 | |
| 26 | P02 | 01 | |
| : | | : | |
| 38 | | 13 | |
| 39 | | 14 | PM2 |
| : | | : | |
| 50 | | 25 | |
| 51 | P03 | 01 | |
| : | | : | |
| 75 | | 25 | |

SUBSTRATE PROCESSING APPARATUS AND RECORDING MEDIUM

CROSS-REFERENCE TO RELATED APPLICATION

This application is based upon and claims the benefit of priority from Japanese Patent Application Nos. 2017-243741 and 2018-229665, filed on Dec. 20, 2017 and Dec. 7, 2018, respectively, the entire contents of which are incorporated herein by references.

TECHNICAL FIELD

The present disclosure relates to a substrate processing apparatus and a recording medium.

BACKGROUND

Conventionally, in a semiconductor manufacturing apparatus which is a type of substrate processing apparatus, a boat as a substrate holder, on which wafers as substrates are loaded, is loaded into a furnace heated to a predetermined temperature by a heater as a heating means, the interior of the furnace becomes a vacuum state, a reaction gas is introduced from a reaction gas introduction pipe, a process is performed on the surfaces of the wafers, and an exhaust gas is exhausted from an exhaust pipe. The boat has a plurality of posts and holds a plurality of wafers horizontally with grooves (hereinafter also referred to as slots) formed in the posts.

In recent years, a process using a small lot (for example, 50 or 75 product substrates) has been mainly adopted. To cope with the small lot, the related art discloses a semiconductor manufacturing apparatus that processes 50 or less product substrates by a single mini batch process. In addition, the related art discloses a multi-wafer apparatus in which product substrates are distributed and transferred to a plurality of process chambers for processing the product substrates, each for processing a predetermined number of product substrates (for example, five product substrates). However, these techniques cannot cope with the recent demand for multiple types with a small amount, improvement in integration density, and quality improvement.

In addition, with the mini-batch of product substrates, there is a need for development of an apparatus capable of processing a plurality of film types, while achieving both short TAT (Turn Around Time) for increasing a customer device development speed, and batch processing of product substrates.

SUMMARY

Some embodiments of the present disclosure provide a configuration capable of coping with mass production in a relatively small lot production accompanied with the recent multiple types with a small amount.

According to some embodiments of the present disclosure, there is provided a configuration including a substrate holder configured to hold a plurality of substrates including a product substrate and a dummy substrate, a transfer mechanism that loads the substrates into the substrate holder, a storage part configured to store a device parameter including at least the number of substrates that can be loaded on the substrate holder and the number of product substrates to be loaded on the substrate holder, and a controller configured to: (1) create substrate transfer data, which includes information indicating an order for transferring the substrates, transfer source information of the substrates mounted on the substrate holder, and transfer destination information indicating a process chamber for processing the substrates, according to the device parameter, (2) read the created substrate transfer data, (3) by transferring the substrates to the transfer mechanism based on the read substrate transfer data, transfer the dummy substrate to a substrate holding region except for a heat equalization region in an entire substrate holding region on the substrate holder, and transfer the product substrate to the heat equalization region in a remaining substrate holding region on the substrate holder.

BRIEF DESCRIPTION OF DRAWINGS

FIG. 6B is a diagram showing apparatus parameters according to the embodiments of the present disclosure.

FIG. 6C is a diagram showing apparatus parameters according to the embodiments of the present disclosure.

FIG. 6D is a diagram showing apparatus parameters according to the embodiments of the present disclosure.

FIG. 7 is a diagram showing carrier information according to the embodiments of the present disclosure.

FIG. 8A is a flowchart for determining a process module PM from user information according to the embodiments of the present disclosure.

FIG. 8B is a flowchart for determining a process module PM from user information according to the embodiments of the present disclosure.

FIGS. 12A and 12B are diagrams showing substrate transfer data according to the embodiments of the present disclosure.

FIG. 13 is a diagram showing substrate transfer data according to the embodiments of the present disclosure.

DETAILED DESCRIPTION (Outline of Substrate Processing Apparatus)

Now, one of a lot of embodiments of the present disclosure will be described with reference to FIGS. 1 and 2. In the embodiments to which the present disclosure is applied, a substrate processing apparatus is configured as a substrate processing apparatus for performing a method of manufacturing a semiconductor device (IC) as an example. In the following descriptions, the substrate processing apparatus is a vertical type apparatus that performs various processes such as oxidation, diffusion, CVD and the like on a substrate (hereinafter simply referred to as a processing apparatus).

Figure 1:
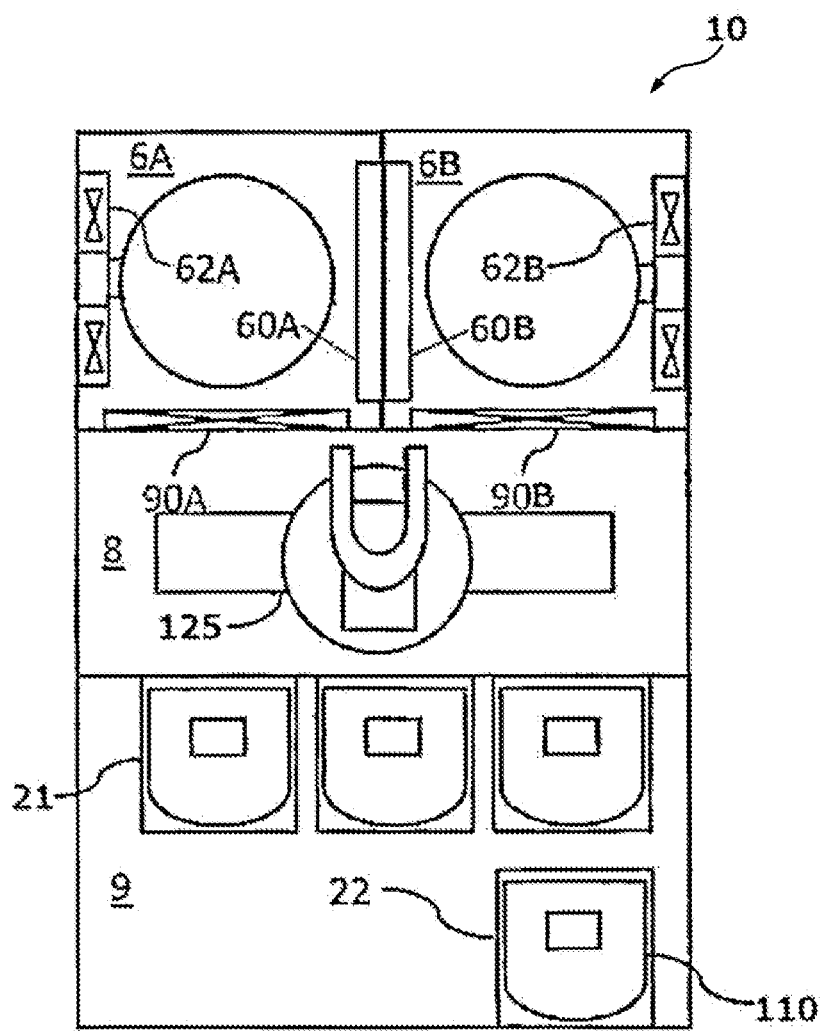
FIG. 1 is an example cross-sectional view showing a substrate processing apparatus suitably used in some embodiments of the present disclosure.
Figure 2:
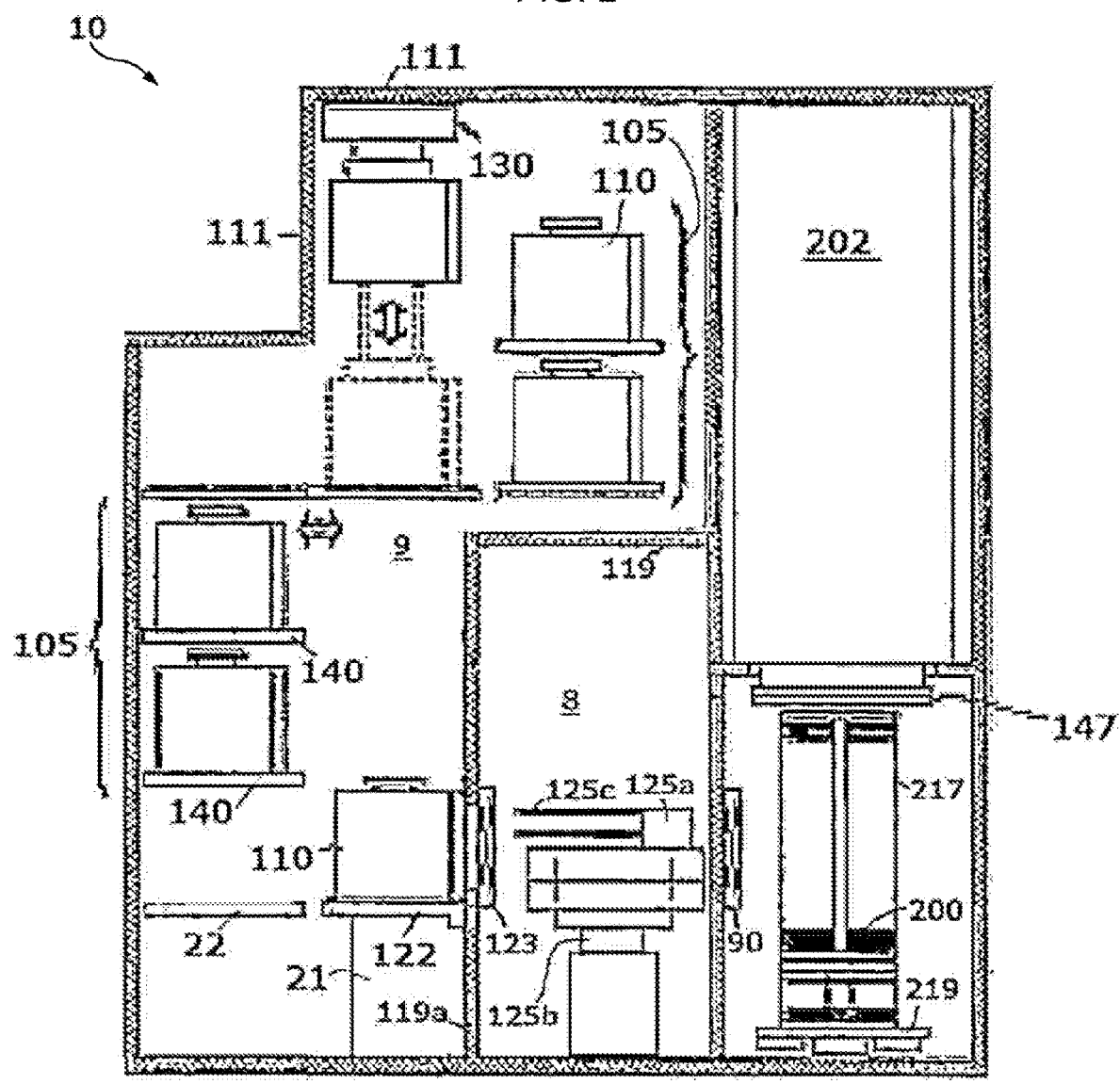
FIG. 2 is an example longitudinal sectional view showing the substrate processing apparatus suitably used in some embodiments of the present disclosure.

As shown in FIGS. 1 and 2, the substrate processing apparatus 10 includes two adjacent process modules PM as process furnaces 202 to be described later. Each process module PM is a vertical process module PM that collectively processes tens of wafers 200 as substrates. For example, about 20 to 100 (preferably, 25 to 75) substrates 200 per one process module PM can be processed.

Transfer chambers 6A and 6B as preparatory chambers are placed below the process furnace 202. On the front side of the transfer chambers 6A and 6B, a transfer chamber 8 includes a wafer transfer mechanism 125 for transferring the wafers 200 as substrates. The wafer transfer mechanism is disposed adjacent to the transfer chambers 6A and 6B. In some embodiments, the process furnaces 202 are installed above the respective transfer chambers 6A and 6B, which is described later.

A reception chamber 9 (pod transferring space) for receiving a pod (FOUP) 110 as an accommodation container (carrier) for accommodating a plurality of wafers 200 is installed on the front side of the transfer chamber 8. A load port 22 as an I/O port is installed on the entire surface of the reception chamber 9, and the pod 110 is loaded into and unloaded from the processing apparatus 2 via the load port 22. Twenty five holding parts for mounting the wafers 200 thereon are installed in the pod 110.

Gate valves 90A and 90B as isolating parts are installed in the boundary wall (adjacent surface) between the transfer chambers 6A and 6B and the transfer chamber 8. Pressure detectors are installed in the transfer chamber 8 and the transfer chambers 6A and 6B, respectively, and the internal pressure of the transfer chamber 8 is set to be lower than the internal pressures of the transfer chambers 6A and 6B. Oxygen concentration detectors are installed in the transfer chamber 8 and the transfer chambers 6A and 6B, respectively, and the oxygen concentrations in the transfer chamber 8A and the transfer chambers 6A and 6B are maintained to be lower than the oxygen concentration in the atmosphere. Specifically, the oxygen concentration is maintained at 30 ppm or less.

A clean unit (not shown) configured to supply clean air into the transfer chamber 8 is installed on the ceiling of the transfer chamber 8 and is configured to circulate an inert gas as clean air in the transfer chamber 8. By circulating and purging the interior of the transfer chamber 8 with the inert gas, it is possible to make the interior of the transfer chamber 8 clean.

With such a configuration, it is possible to prevent particles and the like of the transfer chambers 6A and 6B from being introduced into the process furnace 202 (not shown) with being mixed, thereby preventing a natural oxide film from being formed on the wafers 200 in the transfer chamber 8 and the transfer chambers 6A and 6B.

A plurality of pod openers 21 (for example, three pod openers 21), each for opening and closing the lid of the pod 110, are arranged in the rear side of the reception chamber 9 at the boundary wall between the reception chamber 9 and the transfer chamber 8. The pod opener 21 opens the lid of the pod 110, so that the wafers 200 in the pod 110 are loaded into and unloaded from the transfer chamber 8.

As shown in FIG. 2, the substrate processing apparatus 10, which accommodates a plurality of wafers 200 made of silicon or the like and uses the pod 110, includes a housing 111 used as a main body of the substrate processing apparatus.

At the front portion of the front wall of the housing 111, a front maintenance port (not shown) as an opening is formed in an open state for maintenance, and a front maintenance door for opening and closing the front maintenance port is installed. In addition, a pod loading/unloading port is opened on the front wall so as to communicate between the interior and the exterior of the housing 111. The pod loading/unloading port may be configured to be opened and closed by a front shutter (not shown).

The load port 22 used as a loading/unloading part is installed in the pod loading/unloading port, and the load port 22 is configured to load the pod 110 thereon with the location aligned. The pod 110 is loaded onto the load port 22 by an in-process transfer device and is unloaded from the load port 22.

At the rear side of the front surface of the housing 111, storage shelves (pod shelves) 105 are arranged in the form of a matrix in all the directions around the pod loading/unloading port. Each pod shelf 105 is provided with a mounting part 140 as a storage part for mounting a pod. The storage part is constituted by the mounting part 140 and a horizontal movement mechanism for horizontally moving the mounting part 140 between a standby position where the pod 110 is stored and a delivery position where the pod 110 is delivered. A single stage of the pod shelf 105 is constituted by a plurality of independent mounting parts140, which is arranged on the same straight line in the horizontal direction, and the pod shelves are installed in plural stages in the vertical direction. The mounting part 140 can be independently moved horizontally without being synchronized with the vertically or horizontally adjacent mounting parts 140 and any other mounting parts 140. A pod transfer device 130 is configured to transfer the pod 110 between the load port 22, the pod shelf 105 and the pod opener 21.

At the front side of a sub-housing 119 inside the housing 111, pod shelves (storage shelves) 105 as storage parts are arranged in the form of a matrix in all the directions. As the same with the pod shelves 105 on the front rear side of the housing 111, the mounting part 140 for mounting the pod of each pod shelf 105 is independently moved horizontally without being synchronized with the vertically or horizontally adjacent mounting parts 140. The pod shelf 105 is configured to hold the pods 110 in a state that the pods 110 are mounted on a plurality of mounting parts 140 one by one.

At the front wall 119a of the sub-housing 119, a pair of wafer loading/unloading ports 120 for loading/unloading the wafers 200 into/from the sub-housing 119 is formed in an open state with being arranged at left and right sides in the horizontal direction. A pair of pod opener 21 is installed in the pair of loading/unloading ports 120, respectively. Each pod opener 21 includes a mounting table 122 on which the pod 110 is mounted and a cap attaching/detaching mechanism 123 for attaching/detaching a cap of the pod 110 used as a sealing member. The pod opener 21 is configured to open and close the wafer entrance of the pod 110 by attaching/detaching the cap of the pod 110 mounted on the mounting table 122 by the cap attaching/detaching mechanism 123. The mounting table 122 may sometimes be referred to as a mounting part 140.

The sub-housing 119 constitutes the transfer chamber 8 which is fluidly isolated from a space where the pod transfer device 130 and the pod shelf 105 are installed. A wafer transfer mechanism (which may also be referred to a transfer mechanism or substrate transfer mechanism) 125 is installed in a front region of the transfer chamber 8. The wafer transfer mechanism 125 includes a wafer transfer device 125a that can rotate or translate the wafers 200 in the horizontal direction, and a wafer transfer device elevator 125b that moves up and down the wafer transfer device 125a. The wafers 200 can be loaded (charged)/unloaded (discharged) onto/from a boat 217 (which may also be referred to as a substrate holder), with an arm (substrate holder) 125c of the wafer transfer device 125a as a mounting part of the wafers 200, through a continuous operation of the wafer transfer device elevator 125b and the wafer transfer device 125a.

A transfer chamber 6 as a standby part for accommodating the boat 217 via a gate valve 90 and making the boat 217 stand by is formed in the rear region of the transfer chamber 8. The process furnace 202 having a process chamber therein is installed above the transfer chamber 6. The lower end portion of the process furnace 202 is configured to be opened and closed by a furnace port shutter 147.

The boat 217 is moved up and down by a boat elevator 115 (not shown) to be introduced into the process furnace. A seal cap 219 as a lid is installed horizontally on a connection member (not shown) connected to an elevating base of the boat elevator 115. The lid 219 is configured to vertically support the boat 217 and to be able to close the lower end portion of the process furnace 202. The boat 217 has a plurality of reinforcement members and is configured to horizontally hold a plurality of wafers 200 with the centers of the wafers 200 aligned in the vertical direction.

Next, the operation of the substrate processing apparatus 10 will be described. An example in which the above-described substrate processing apparatus 10 is used to perform substrate processing as one step of a process of manufacturing a semiconductor device will be described. In the present disclosure in some embodiments, when a sequence recipe to be described later is executed, a controller 121 controls the operation of each of the parts constituting the substrate processing apparatus 10 to start the substrate processing.

When the pod 110 is supplied to the load port 22, the pod 110 on the load port 22 is loaded into the housing 111 from the pod loading/unloading port by a pod loading device. The loaded pod 110 is automatically transferred and delivered to a designated mounting part 140 of the pod shelf 105 by the pod transfer device 130 and is temporarily stored. Thereafter, the pod 110 is transferred and delivered from the pod shelf 105 to one pod opener 21 and then mounted on the mounting table 122 or is directly transferred to the pod opener 21 and then mounted on the mounting table 122.

A side end surface of the opening of the pod 110 mounted on the mounting table 122 is pushed against the edge portion of the opening of the wafer loading/unloading port 120 in the front wall 119a of the sub-housing 119, and its cap is detached by the cap attaching/detaching mechanism 123 to open the wafer entrance. When the pod 110 is opened by the pod opener 21, the wafer 200 is held by the arm 125c of the wafer transfer device 125a from the pod 110 through the wafer entrance, loaded into the transfer chamber 6, which is in a rear side of the transfer chamber 8, through the gate valve 90, and loaded (charged) in the boat 217. The wafer transfer device 125a which has delivered the wafer 200 to the boat 217 returns to the pod 110 and loads the next wafer 200 in the boat 217.

When a predetermined number of wafers 200 are loaded in the boat 217, the pre-processing is continued. When the pre-processing is completed, the main processing (here, a process recipe) is executed. When this process recipe is started, the lower end portion of the process furnace 202, which has been closed by the furnace port shutter 147, is opened by the furnace port shutter 147. Subsequently, the boat 217 holding the group of wafers 200 is loaded into the process furnace 202 as the seal cap 219 is moved up by the boat elevator 115.

After the loading, arbitrary processing is performed on the wafer 200 in the process furnace 202. After the processing, the wafer 200 and the pod 110 are unloaded from the housing in the reverse procedure to the above.

(Process Furnace of Substrate Processing Apparatus)

Figure 3:
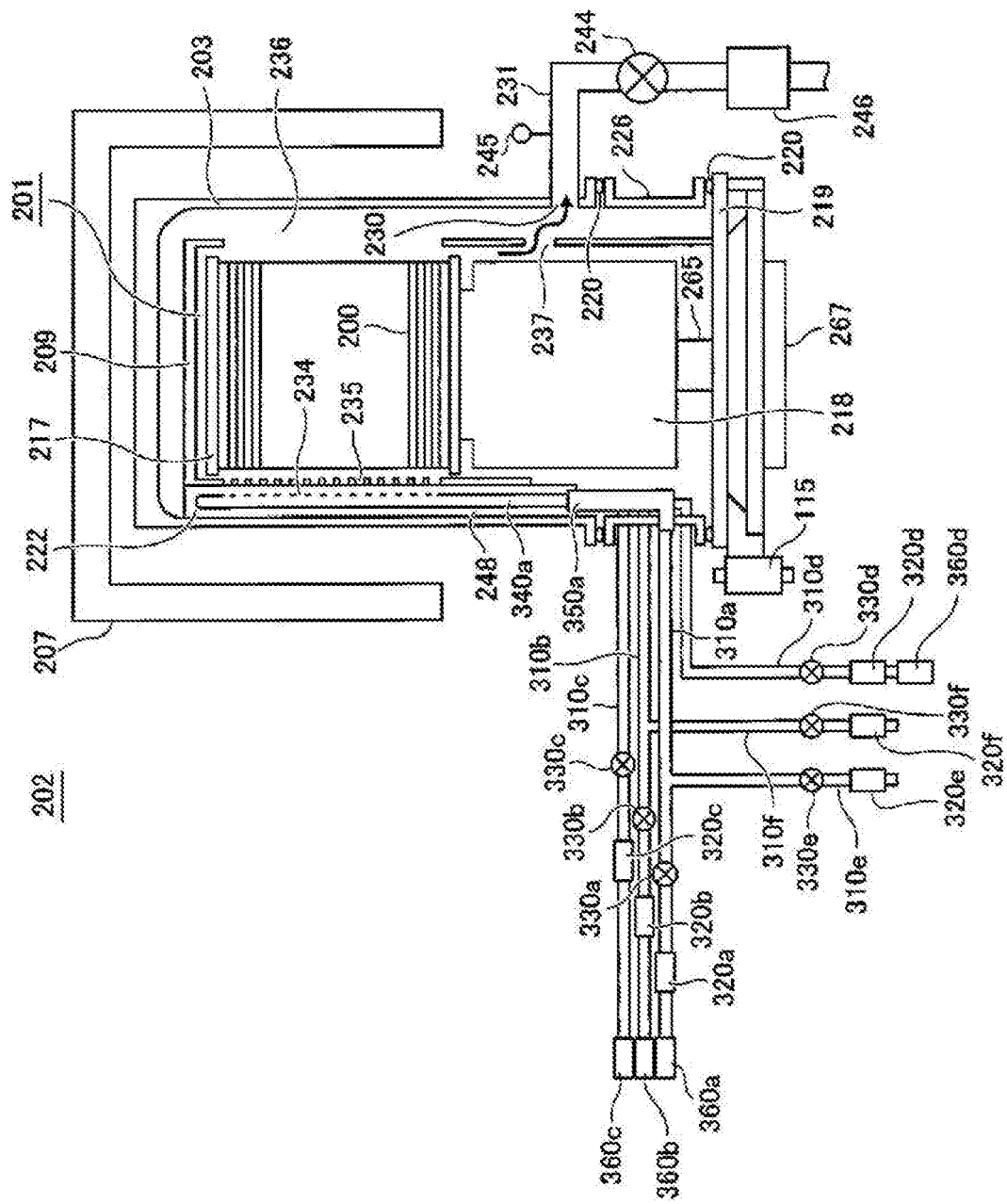
FIG. 3 is an example longitudinal sectional view showing a process furnace of the substrate processing apparatus suitably used in some embodiments of the present disclosure.

As shown in FIG. 3, the process furnace 202 has a heater 207 as a heating mechanism. The heater 207 has a cylindrical shape and is supported vertically by being supported by a holding plate (not shown). The heater 207 also acts as an activation mechanism for activating a processing gas with heat.

A reaction tube 203 constituting a reaction container (processing container) is disposed inside the heater 207 in a concentric relation with the heater 207. The reaction tube 203 is made of a heat resistant material such as quartz ($SiO_2$) or silicon carbide (SiC). The reaction tube 203 is formed in a shape having a ceiling with its lower end opened and its upper end closed by a wall body of a flat shape. The reaction tube 203 has a cylindrical portion 209 formed in a cylindrical shape, a nozzle arrangement chamber 222 partitioned between the cylindrical portion 209 and the reaction tube 203, a gas supply slit 235 as a gas supply port formed in the cylindrical portion 209, a first gas exhaust port 236 formed in the cylinder portion 209, and a second gas exhaust port 237 formed in the cylinder portion 209 below the first gas exhaust port 236. The cylindrical portion 209 is formed in a shape having a ceiling with its lower end opened and its upper end closed by a wall body of a flat shape. Further, the cylindrical portion 209 is installed immediately in the vicinity of the wafer 200 so as to surround the wafer 200. A process chamber 201 is formed inside the cylindrical portion 209 of the reaction tube 203. The process chamber 201 is configured to be able to process the wafer 200. In addition, the process chamber 201 is configured to be able to accommodate the boat 217 as a substrate holder capable of holding the wafers 200 in a state in which the wafers 200 are vertically aligned in multiple stages in a horizontal posture.

The lower end of the reaction tube 203 is supported by a cylindrical manifold 226. The manifold 226 is made of metal such as a nickel alloy or stainless steel, or is made of a heat resistant material such as quartz or SiC. A flange is formed at the upper end portion of the manifold 226, and the lower end portion of the reaction tube 203 is installed on this flange to be supported thereon. An airtight member 220 such as an O-ring is interposed between the flange and the lower end portion of the reaction tube 203 to keep the interior of the reaction tube 203 in an airtight state.

A seal cap 219 is air-tightly attached to the opening of the lower end of the manifold 226 via the airtight member 220 such as an O-ring and air-tightly seals the opening of the lower end of the reaction tube 203, that is, the opening of the manifold 226.

The boat 217 is installed to stand on a boat support base 218. The boat 217 is made of a heat resistant material such as quartz or SiC. The boat 217 has a bottom plate fixed to the boat support base 218 and a top plate arranged above the boat support base 218, and a plurality of posts installed between the bottom plate and the top plate. A plurality of wafers 200 are held in the boat 217. The plurality of wafers 200 are stacked in multiple stages in the tube axis direction of the reaction tube 203 in a state where the wafers 200 are held horizontally in a horizontal posture at intervals, with their centers aligned with each other, and are supported by the posts of the boat 217.

A boat rotation mechanism 267 for rotating the boat is installed on the opposite side of the process chamber 201 from the seal cap 219. A rotary shaft 265 of the boat rotation mechanism 267 is connected to the boat support base 218 through the seal cap. The boat rotation mechanism 267 rotates the wafers 200 by rotating the boat 217 via the boat support base 218.

The seal cap 219 is moved up and down in the vertical direction by the boat elevator 115 as an elevating mechanism installed outside the reaction tube 203 so that the boat 217 can be loaded into and unloaded from the process chamber 201.

In the manifold 226, nozzle supports 350a to 350d for supporting nozzles 340a to 340d as gas nozzles for supplying a processing gas into the process chamber 201 are installed to penetrate the manifold 226. Here, four nozzle supports 350a to 350d are installed. The nozzle supports 350a to 350d are made of a material such as a nickel alloy or stainless steel. Gas supply pipes 310a to 310c for supplying a gas into the process chamber 201 are connected to one ends of the nozzle supports 350a to 350c on the side of the reaction tube 203, respectively. A gas supply pipe 310d for supplying a gas into a gap S formed between the reaction tube 203 and the cylindrical portion 209 is connected to one end of the nozzle support 350d on the side of the reaction tube 203. In addition, the nozzles 340a to 340d are connected to the other ends of the nozzle supports 350a to 350d, respectively. The nozzles 340a to 340d are made of a heat resistant material such as quartz or SiC.

In the gas supply pipe 310a, a first processing gas supply source 360a for supplying a first processing gas, a mass flow controller (MFC) 320a, which is a flow rate controller (flow rate control part), and a valve 330a, which is an opening/closing valve, are installed in order from the upstream side. In the gas supply pipe 310b, a second processing gas supply source 360b for supplying a second processing gas, an MFC 320b and a valve 330b are installed in order from the upstream side. In the gas supply pipe 310c, a third processing gas supply source 360c for supplying a third processing gas, an MFC 320c and a valve 330c are installed in order from the upstream side. In the gas supply pipe 310d, an inert gas supply source 360d for supplying an inert gas, an MFC 320d and a valve 330d are installed in order from the upstream side. Gas supply pipes 310e and 310f for supplying an inert gas are connected to the downstream sides of the valves 330a and 330b of the gas supply pipes 310a and 310b, respectively. In the gas supply pipes 310e and 310f, MFCs 320e and 320f and valves 330e and 330f are installed in order from the upstream side, respectively.

A first processing gas supply system is mainly constituted by the gas supply pipe 310a, the MFC 320a and the valve 330a. The first processing gas supply source 360a, the nozzle support 350a and the nozzle 340a may be included in the first processing gas supply system. A second processing gas supply system is mainly constituted by the gas supply pipe 310b, the MFC 320b and the valve 330b. The second processing gas supply source 360b, the nozzle support 350b and the nozzle 340b may be included in the second processing gas supply system. A third processing gas supply system is mainly constituted by the gas supply pipe 310c, the MFC 320c and the valve 330c. The third processing gas supply source 360c, the nozzle support 350c and the nozzle 340c may be included in the third processing gas supply system. An inert gas supply system is mainly constituted by the gas supply pipe 310d, the MFC 320d and the valve 330d. The inert gas supply source 360d, the nozzle support 350d and the nozzle 340d may be included in the inert gas supply system.

An exhaust port 230 is formed in the reaction tube 203. The exhaust port 230 is formed below the second gas exhaust port 237 and is connected to an exhaust pipe 231. A vacuum pump 246, which is a vacuum exhaust device, is connected to the exhaust pipe 231 via a pressure sensor 245, which is a pressure detector for detecting the internal pressure of the process chamber 201, and an APC (Auto Pressure Controller) valve 244, which is a pressure regulator. The vacuum pump 246 is configured to vacuum-exhaust the interior of the process chamber 201 so that the internal pressure of the process chamber 201 reaches a predetermined pressure. The exhaust pipe 231 on the downstream side of the vacuum pump 246 is connected to an exhaust gas processing device (not shown) or the like. The APC valve 244 is an opening/closing valve that can be opened and closed to vacuum-exhaust the interior of the process chamber 201 and stop the vacuum exhaust and can adjust the internal pressure of the process chamber 201 through conductance adjustment by regulating the degree of valve opening. An exhaust system functioning as an exhaust part is mainly constituted by the exhaust pipe 231, the APC valve 244 and the pressure sensor 245. The vacuum pump 246 may be included in the exhaust system.

A temperature sensor (not shown) as a temperature detector is installed in the reaction tube 203. It is configured to adjust power supplied to the heater 207 based on the temperature information detected by the temperature sensor such that the temperature inside the process chamber 201 becomes a desired temperature distribution.

In the above-described process furnace 202, in a state where a plurality of wafers 200 to be processed in batch are stacked on the boat 217 in multiple stages, the boat 217 is inserted into the process chamber 201 while being supported by the boat support base 218, and the heater 207 heats the wafers 200 inserted in the process chamber 201 to a predetermined temperature.

(Controller Configuration)

Figure 4:
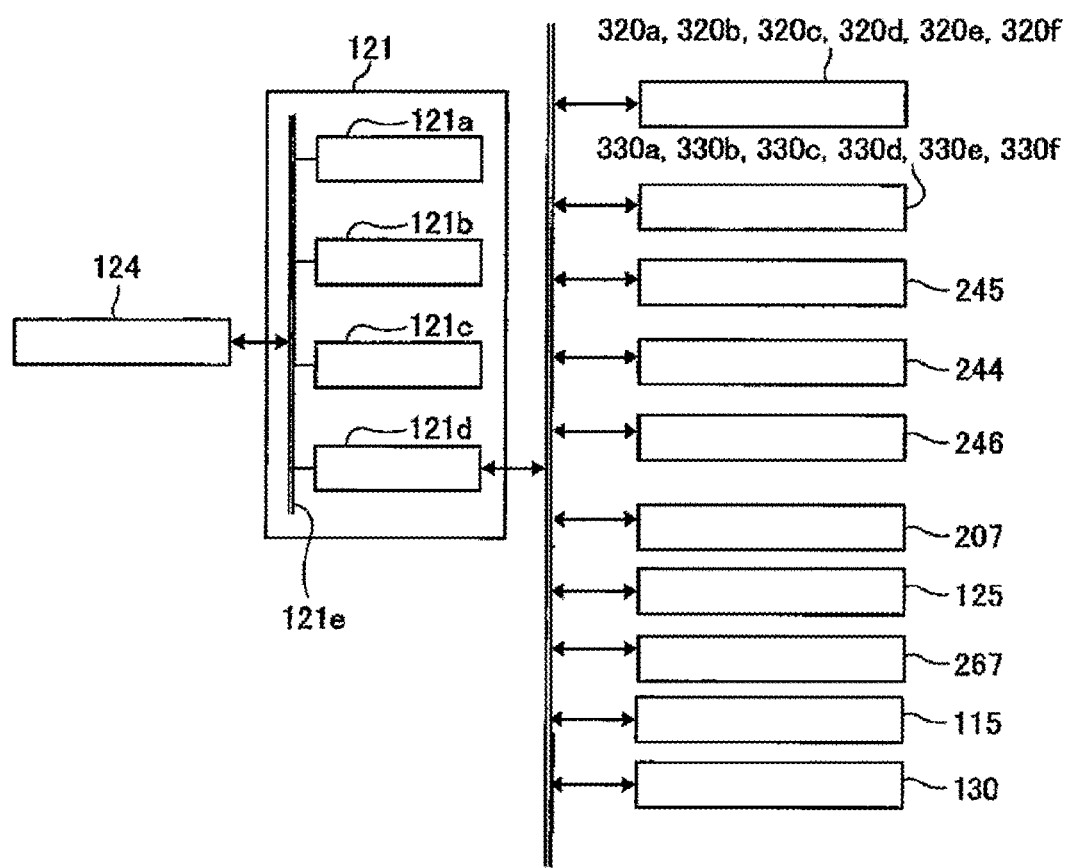
FIG. 4 is a diagram for explaining a functional configuration of a controller suitably used in some embodiments of the present disclosure.

As shown in FIG. 4, the controller 121, which is a control part (control means), is configured as a computer including a CPU (Central Processing Unit) 121a, which is an execution part, a RAM (Random Access Memory) 121b, a storage device 121c, which is a storage part, and an I/O port 121d. The RAM 121b, which is configured as a memory area (work area) in which programs, data and the like read by the CPU 121a are temporarily stored, the storage device 121c and the I/O port 121d are configured to exchange data with the CPU 121a via an internal bus 121e. An input/output device 124, which is an operation part configured as a touch panel or the like, is connected to the controller 121.

The storage device 121c is configured with, for example, a flash memory, an HDD (Hard Disk Drive) or the like. A control program for controlling the operation of the substrate processing apparatus, and process recipes in which procedures, conditions and the like of the substrate processing are written, are readably stored in the storage device 121c. The process recipes are combined to obtain a predetermined result by causing the controller 121 to execute the respective steps in the substrate processing process to be described later, and the storage device 121c stores device data generated by operating the parts constituting the apparatus by executing sequence recipes to be described later, which include the process recipes. Time data is added to the device data by a time stamp function of the controller 121.

In addition, the storage device 121c stores the control programs and the like according to the embodiments. The CPU 121a is configured to execute these programs in response to an input of an operation command from the input/output device 124 or the like. In addition, the storage device 121c stores programs for realizing various flowcharts of a substrate processing sequence, a work or the like in the embodiments, and stores various setting parameters used for executing these programs and a screen file including various setting screen files.

In the present disclosure, the term "program" may include only a process recipe, only a control program, or both.

The I/O port 121d is connected to the MFCs 320a to 320f, the valves 330a to 330f, the pressure sensor 245, the APC valve 244, the vacuum pump 246, the heater 207, the temperature sensor, the boat rotation mechanism 267, the boat elevator 115, etc.

The CPU 121a is configured to read and execute the control program from the storage device 121c. The CPU 121a also reads the process recipes from the storage device 121c according to an input of an operation command from the input/output device 124. The CPU 121a is configured to control the flow rate adjusting operation of various kinds of gases by the MFCs 320a to 320f, the opening/closing operation of the valves 330a to 330f, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor, the operation of rotating the boat 217 with the rotation mechanism 267 and adjusting the rotation speed of the boat 217, the operation of moving the boat 217 up and down with the boat elevator 115, and so on, according to contents of the process recipes read through the I/O port 121d.

Next, a substrate processing process corresponding to the main process of the process job will be described with reference to FIG. 3. In the embodiments, the controller 121 performs the substrate processing process by executing the process recipes. In addition, the process recipes are substrate processing recipes to be executed in this main process, and are controlled by the controller 121. The controller 121 controls the operations of the parts constituting the substrate processing apparatus 10 to perform a predetermined process on the wafers 200.

(Substrate Processing Process)

The boat 217 on which a predetermined number of wafers 200 are mounted is inserted into the reaction tube 203, and the reaction tube 203 is hermetically sealed by the seal cap 219. The wafers 200 are heated in the hermetically sealed reaction tube 203, and a processing gas is supplied into the reaction tube 203 to perform a predetermined process on the wafers 200.

As the predetermined process, for example, a SiN film is formed on each wafer 200 by alternately supplying an $NH_3$ gas as a first processing gas, an HCDS gas as a second processing gas, and a $N_2$ gas as a third processing gas.

First, the HCDS gas is supplied into the process chamber 201 from the gas supply pipe 310b of the second processing gas supply system via the gas supply hole 234b of the nozzle 340b and the gas supply slit 235. Specifically, by opening the valves 330b and 330f, the supply of the HCDS gas into the process chamber 201 from the gas supply pipe 310b is started together with a carrier gas. At this time, the opening degree of the APC valve 244 is adjusted to maintain the internal pressure of the process chamber 201 at a predetermined pressure. With lapse of a predetermined time, the valve 330b is closed to stop the supply of the HCDS gas.

The HCDS gas supplied into the process chamber 201 is supplied to the wafers 200, flows in parallel on the wafers 200, flows downward through the gap S via the first gas exhaust port 236, and is exhausted from the exhaust pipe 231 via the second gas exhaust port 237 and the exhaust port 230.

While supplying the HCDS gas into the process chamber 201, the valve 330e of the inert gas supply pipe connected to the gas supply pipe 310a and the valves 330c and 330d of the gas supply pipes 310c and 310d are opened to allow an inert gas such as a $N_2$ gas to flow, thereby preventing the HCDS gas from flowing into the gas supply pipes 310a, 310c and 310d.

After closing the valve 330b to stop the supply of the HCDS gas into the process chamber 201, the interior of the process chamber 201 is exhausted to remove the HCDS gas, reaction products and the like remaining in the process chamber 201. At this time, if an inert gas such as a $N_2$ gas is supplied from the gas supply pipes 310a, 310b, 310c and 310d into the process chamber 201 and the gap S for purging, it can be more effective to exclude the residual gas from the process chamber 201 and the gap S.

Next, the $NH_3$ gas is supplied into the process chamber 201 from the gas supply pipe 310a of the first processing gas supply system via the gas supply hole 234a of the nozzle 340a and the gas supply slit 235. Specifically, by opening the valves 330a and 330e, the supply of the $NH_3$ gas into the process chamber 201 from the gas supply pipe 310a is started together with a carrier gas. At this time, the opening degree of the APC valve 244 is adjusted to maintain the internal pressure of the process chamber 201 at a predetermined pressure. With lapse of a predetermined time, the valve 330a is closed to stop the supply of the $NH_3$ gas.

The $NH_3$ gas supplied into the process chamber 201 is supplied to the wafers 200, flows in parallel on the wafers 200, flows downward through the gap S via the first gas exhaust port 236, and is exhausted from the exhaust pipe 231 via the second gas exhaust port 237 and the exhaust port 230.

While supplying the $NH_3$ gas into the process chamber 201, the valve 330f of the inert gas supply pipe 310f connected to the gas supply pipe 310b and the valves 330c and 330d are opened to allow an inert gas such as a $N_2$ gas to flow, thereby preventing the $NH_3$ gas from flowing into the gas supply pipes 310b, 310c and 310d.

After closing the valve 330a to stop the supply of the $NH_3$ gas into the process chamber 201, the interior of the process chamber 201 is exhausted to remove the $NH_3$ gas, reaction products and the like remaining in the process chamber 201. At this time, if an inert gas such as a $N_2$ gas is supplied from the gas supply pipes 310a, 310b, 310c and 310d into the process chamber 201 and the gap S for purging, it can be more effective to exclude the residual gas from the process chamber 201 and the gap S.

Upon completion of the processing on the wafers 200, the boat 217 is unloaded from the reaction tube 203 by a procedure reverse to the above operation.

Although the above embodiments have been described that the first processing gas and the second processing gas are alternately supplied, the present disclosure may also be applicable to a case where the first processing gas and the second processing gas are supplied at the same time.

Next, a flow of substrate processing in the embodiments will be described with reference to FIG. 5. A substrate processing sequence in the embodiments is configured to be executed by the control part 121 from step S300 to be described below.

At, S100, this step is a step of preparing various parameter settings and recipes to be used (preparing step). In this step, the substrate processing sequence stored in advance in the storage part 121c and parameters (hereinafter also referred to as device parameters) used for a flow (sub-sequence) and recipes, which are executed in the substrate processing sequence, are set by designation and selection on an operation screen. Further, designation and selection may be performed on the operation screen to create each flow or recipe and then stored in the storage part 121c.

Figures 5, 6A:
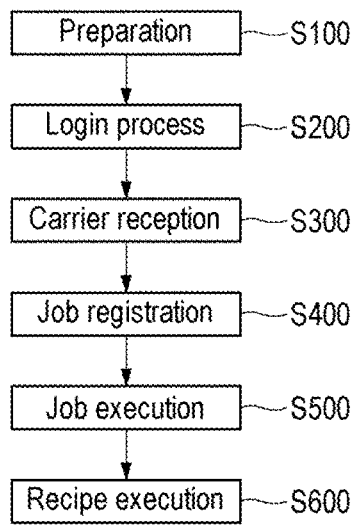
FIG. 5 is a diagram showing a flow of substrate processing in a substrate processing apparatus suitably used in some embodiments of the present disclosure.
FIG. 6A is a diagram showing apparatus parameters according to the embodiments of the present disclosure.

In the embodiments, according to maintenance item selection parameters shown in FIG. 6A, when each process module is in a standby state, a process module PM to be used with priority is set by a maintenance number. A maintenance number "00" is the specification that the process module PM (either PM1 or PM2) used this time is stored in the controller 121 and a process module PM that is not the stored process module PM is used next time. Maintenance numbers "01" and "02" indicate fixed process modules PM1 and PM2, respectively.

If the maintenance number is other than the above, current values related to the maintenance item corresponding to the maintenance number are compared in each process module PM, and a process module PM having a smaller value is selected. As shown in FIG. 6A, the maintenance items include the number of resident dummy wafer uses, a film thickness value, a recipe film thickness value, the number of recipe executions, the number of recipe step executions, execution time, and the like. The maintenance item selection parameters are stored in the storage part 121c as device parameters.

A login user designation parameter shown in FIG. 6B is a parameter for setting a process module PM to be used for each login user in advance, and is set in advance on a setting screen (not shown). By registering a range of process modules PM, which can be operated by the login user, in advance, it is possible to specify a process module PM to be processed from information on the user which has been logged-in. Thus, the control part 121 can automatically select a processing target module PM.

As shown in FIG. 6B, "PM1" indicates that the process module PM1 is usable, "PM2" indicates that the process module PM2 is usable, and "ALL" indicates that the process module PM1 and the process module PM2 are usable in common. The login user designation parameter is stored as a device parameter in the storage part 121c.

A carrier ID registration parameter shown in FIG. 6C is a parameter for setting a usable process module PM at a prefix of the carrier ID for each carrier type, and is set in advance on a setting screen (not shown). Here, "SD" shown in FIG. 6C indicates a carrier 110 in which side dummy wafers are stored, "M1" and "M2" indicate carriers 110 in which monitor wafers are stored, "PD" indicates a carrier 110 in which product substrates are stored, "FD" indicates a carrier 110 in which supplementary dummy wafers are stored, and "R1" and "R2" indicate collection-only carrier 110 for monitor wafers.

DA defined in a cell in the "PM1" column of the "SD" row and DB defined in a cell in the "PM2" column indicate the prefix of the carrier ID as reactor information, respectively. The reactor information will be described later. The definition with this prefix can be up to maximum 4 characters. Various carriers that are not defined in cells of the "PM1" and "PM2" columns, like the "M1" row, can be used as a default in both the process module PM1 and the process module PM2 in common. The carrier ID registration parameter is stored in the storage part 121c as a device parameter.

FIG. 6D shows a carrier injection determination parameter. As shown in FIG. 6D, an injection operation includes a screen injection (manual injection) method in which a login user operates on a screen to inject a carrier and a HOST input (automatic injection) method that a host computer such as HOST instructs to inject a carrier.

The carrier injection determination parameter is a parameter for showing a relationship between automatic determination of a usable process module PM by a login user, arbitrary selection of a usable process module PM by user, and device automatic determination of a usable process module PM, in a carrier injection operation by a user. Here, the device automatic determination means acquiring reactor information on the process module PM1 and the process module PM2 registered for each carrier type as information of the above-described carrier ID registration parameter, and selecting (determining) a usable process module PM.

In the screen injection method, as shown in FIG. 6D, if the process module PM1 and the process module PM2 are for different film types, selection (determination) of a usable process module PM according to the login user designation parameter shown in FIG. 6 B as user information of the login user is performed. The carrier injection determination parameter is set in advance and stored in the storage part 121c as a device parameter.

Other than the above-described four device parameters, from a wafer arrangement parameter (WAP) defining wafer arrangement designation on the boat 217 which can be designated as one variable parameter of the device parameter, the number of wafers for each wafer type to be used can be calculated in advance, so that it can designate a product substrate 200 to be transferred to a selected process module PM on a wafer basis or a carrier basis according to a device configuration parameter relating to the device configuration. Similarly, these parameters are stored in the storage part 121c as device parameters.

Further, it is configured to display a recipe setting screen of a process recipe or a sequence recipe on the operation screen to select a desired recipe. In this case, a recipe displayed on the recipe setting screen is a recipe that can be executable by the process module PM designated in advance. Further, the total time of the process recipe may be displayed and provided to a user.

At S200, for example, when a recipe is dedicatedly used by a user (login user), a user ID and a password displayed on the operation screen are input to perform a login process.

At S300, when the carrier in which at least a predetermined number of product substrates 200 are accommodated is injected in the substrate processing apparatus 10, the control part 121 acquires the reactor information indicating which process module PM the carrier 110 is usable. Further, the control part 121 may be configured to acquire the reactor information and display it on the operation screen.

Further, as will be described later, the control part 121 can associate the reactor information registered for the login user with the reactor information acquired from the injected carrier 110. For example, the reactor information shown in FIG. 7 indicates that "PM1" is usable in the process module PM1, "PM2" is usable in the process module PM2, and "AUTO" is commonly usable in both the process module PM1 and the process module PM2.

(Method for Determining from Login User)

By registering a range of process modules PM operable by the login user in advance, a usable process module PM is specified and automatically selected from the information on the user which has been logged in. For example, a processing target module PM can be selected based on the user information acquired at the time of the login process in S200. Further, when the carrier 110 is injected, a setting screen may be displayed to be selected by the user.

Specifically, it is configured to execute a flow shown in FIG. 8A by the control part 121.

The control part 121 receives a selection of the type and the number of carriers 110 used for processing from the operation part 124.

The control part 121 determines whether or not the film types to be executed in each process module PM are the same. When the film types are the same, each carrier 110 is set to "AUTO". Then, a setting screen for the user to select a process module PM is displayed.

When determining that the film types to be executed in each process module PM are not the same, the control part 121 acquires login user information to acquire usable reactor information. For each carrier 110, the control part 121 sets a process module PM to be used based on the reactor information acquired from the login user information. This setting is determined as it is when it is not "AUTO" setting. When this setting is "AUTO" setting, it is configured to display a setting screen to be selectable by an operator.

In this manner, when determining a process module PM to be used by the login user, the control part 121 determines whether or not the reactor information acquired from the carrier information coincides with the reactor information set by the login user, so that the login user can use the processing target module PM to process the wafer 200. Here, the basic information of the carrier information includes carrier ID (FOUP ID) information, carrier type (FOUP type) information, wafer map information in the carrier (wafer map information in FOUP), the number of wafers, wafer ID information and the like in addition to the reactor information. Here, the wafer map information is information indicating the slot where the wafer exists.

By specifying a usable process module PM from the login user information, an erroneous operation can be prevented. For example, a carrier can be injected in a process module PM authorized to use to prevent the carrier 110 from being erroneously injected. In addition, it is expected to reduce the number of operations.

The way to specify a usable process module PM from the login user information is effective when the process module PM1 and the process module PM2 are for different film types. This can prevent the user from erroneously injecting a material to be processed in the substrate processing apparatus 10 or can prevent the material from being processed by a wrong process module PM beforehand. Further, this can reduce time and effort of the user to select a process module PM at all times.

(Method for Automatically Determining from Carrier Identification Information)

In a case of injection from a customer host computer, the timing of performing carrier ID automatic determination is when the carrier 110 is transported based on the load port 22 of the substrate processing apparatus 10 and the control part 121 reads and confirms the information of the carrier ID of the carrier 110. FIG. 8B shows a flow for automatic determination from the carrier identification information of the carrier ID.

At S310, when the carrier 110 is injected by the customer host computer, the control part 121 activates this flow. At S311, the control part 121 acquires carrier identification information such as carrier type information, carrier ID information including the prefix of the carrier ID, or the like.

At S312, the control part 121 compares the acquired carrier identification information with a carrier ID designation parameter (hereinafter also referred to as a PM designation parameter) set as a device parameter.

At S313, when the carrier identification information coincides with the PM designation parameter, the control part 121 sets a target process module PM based on the reactor information acquired from the carrier identification information.

At S314, the control part 121 checks whether or not the setting of the target process module PM corresponding to the number of process modules PM to be processed is completed. When not completed, the steps from S311 to S313 are repeated. In this embodiment, since the two process modules PM1 and PM2 are used, the steps are performed twice.

At S315, the control part 121 checks whether or not the target process module PM is set. If already set at S313 ("No"), at S317, an OK response is output and this flow is ended.

At S315, as a result of the checking on the setting of the target process module PM, when not set at S313 ("Yes"), the control part 121 proceeds to the next step at S316 to check whether or not the injected carrier 110 is a job designation carrier. Here, the job designation carrier refers to a processing target material registered in job registration (job creation) to be described later. The processing target material refers to a carrier 110 of a product substrate 200 or a monitor substrate 200 other than the carrier 110 of the dummy wafer 200. A processing target wafer 200 refers to a product wafer 200 or a monitor wafer 200 except for the dummy wafer 200. The wafer types include a product wafer 200, a dummy wafer 200 and a monitor wafer 200, and these are simply referred to as a wafer 200 in case of collectively referring to them.

At S316, the control part 121 checks whether or not the injected carrier 110 is a job designation carrier. If it is a job designation carrier, at S319, the injected carrier 110 is set to AUTO, an OK response is output, and this flow is ended. In the embodiments, even if it is not a job designation carrier, at S318, the injected carrier 110 is set to AUTO, an OK response is output, and this flow is ended.

In the embodiments, on the premise of the film type that the carrier 110 storing the dummy wafer 200 may be used by both the process module PM1 and the process module PM2, at S318 of this flow, the carrier 110 is set to AUTO to be usable for both the process module PM1 and the process module PM2.

For example, if the process module PM1 and the process module PM2 are for different film types and it is impossible to use dummy wafers in common, an NG response is issued for rejection. Possibility (OK) or impossibility (NG) of the common use is set by a device configuration parameter that is one type of device parameters.

Further, according to the present embodiment, reactor information is provided as information of the carrier 110 so that the reactor information can be provided as wafer information to the wafer 200 existing in the carrier 110. According to the embodiments, this reactor information is used as a transport interlock so that the substrate 200 can be used only for the target process module PM to perform a more meticulous process. Here, the wafer information includes wafer ID information, wafer type information, current location information, a current processing state and a current transfer state, as basic information.

The control part 121 is configured to output an OK (no abnormality) response by checking a slot map in the carrier 110 and acquire the reactor information as the wafer information. Further, it is configured to acquire the basic information. In addition, even if it is attempted to transfer the wafer 200 to an unintended process module PM, the control part 121 is configured to issue an alarm and prevent the transfer of the wafer 200.

(Job Registering Process)

Figure 9A:
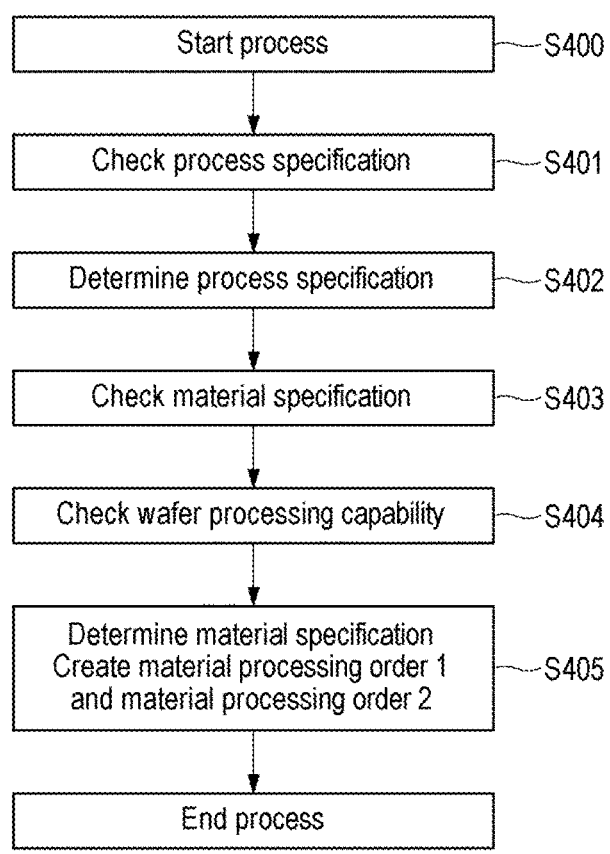
FIG. 9A is a diagram showing a job generation processing flow according to the embodiments of the present disclosure.

At S400, when the process specification and the material specification are designated, that is, after a film forming processing request from an operator or a customer host computer is received and registered in a job queue, the control part 121 is configured to start a job registering (generating) process shown in FIG. 9A at a cycle of one second. In addition, information notified in response to a film-forming process request includes a sequence recipe used in the film formation, process parameters corresponding to the sequence recipe, a carrier 110 of a product wafer 200 to be processed and a monitor wafer 200, and an item number of a holder (slot) for mounting the wafer 200 on the carrier.

Further, the item number of the slot (hereinafter also referred to as a slow number) is sequentially assigned from the bottom similar to the boat 217. In addition, the control part 121 proceeds to determine the priority of the wafers 200 mounted in the carrier 100 or the slots in an order of receiving the information notified in response to the film-forming process request. That is, since the priority is made in an acquiring order of the control part 121, for example, the priority of the wafers 200 is determined in an order of the slot numbers.

At S401, the control part 121 checks the process specification. Specifically, it is checked whether or not a designated recipe is stored in the storage part 121c and parameters used in the recipe are correctly set. At S402, the process specifications are arranged in process module unit. That is, the control part 121 selects a recipe designated this time from the recipes stored in the storage part 121c, and determines the desired process specification.

At S403, next, the control part 121 checks the material specification. Specifically, it is checked whether or not the wafer 200 in the carrier 110 has been processed and this carrier 110 has been reserved for processing by another job.

At S404, the wafer processing capability in all the process modules PM is checked. Specifically, in order to grasp the wafer processing capability of the process modules PM in advance, the control part 121 calculates the number of wafers for each type of wafer to be used from the wafer arrangement parameter WAP stored in the storage part 121c in advance.

The control part 121 calculates the total number of substrates to be used in the current process and calculates the number of wafers in accordance with the wafer layout on the boat 217 for all the wafer types corresponding to the substrate processing apparatus 10. Next, the control part 121 checks whether or not the maximum value and the minimum value of the number of substrates for the type of wafer used in each process module of the process module PM1 and the process module PM2 are equal to each other.

Figure 9B:
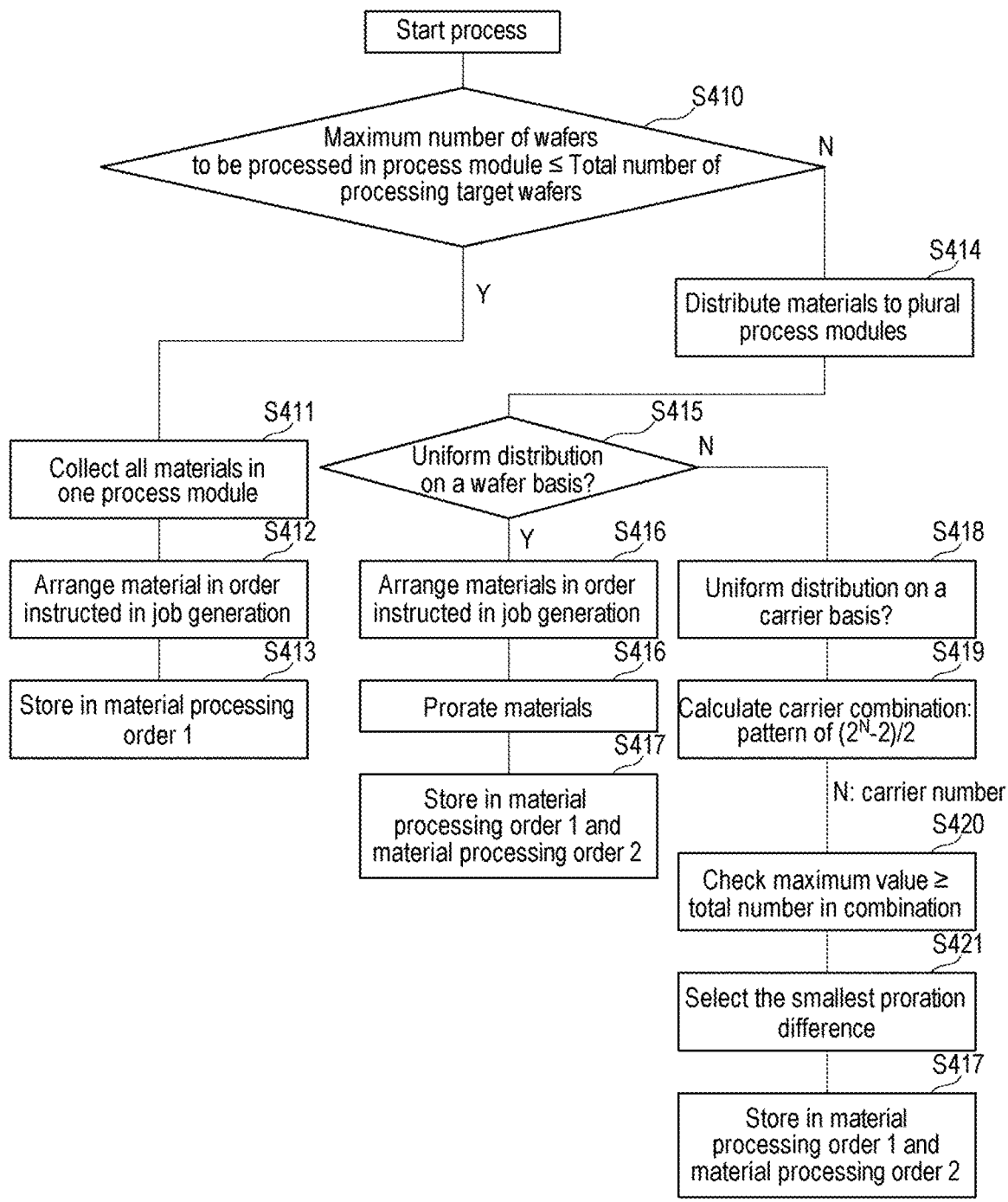
FIG. 9B is a diagram showing a material use determination processing flow according to the embodiments of the present disclosure.

At S405, the control part 121 executes a material specification determination processing sequence shown in FIG. 9B based on the wafer processing capabilities of the process module PM1 and the process module PM2 calculated at S404. Hereinafter, the material specification determination processing sequence shown in FIG. 9B will be described in detail.

At S410, if the maximum number of the processing target wafers of the process module PM1 (or PM2) is smaller than the total number of processing target wafers, all the processing target wafers are collected in the process module PM1 (or PM2) at S411, and the processing target wafers 200 are arranged in an order shown in job creation (order of priority acquired at S400), at S412. Here, the processing order of the processing target wafers 200 is determined in a numerical order of the carriers 100 or in a numerical order of the slots, and the result is stored in the material processing order 1 at S413.

At S410, if the maximum number of the processing target wafers of the process module PM1 (or PM2) is equal to and greater than the total number of the processing target wafers, the processing target wafers 200 are distributed to the plurality of process modules PM at S414. First, it is determined whether or not uniform distribution on a wafer basis is set at S415.

When the uniform distribution on a wafer basis is set, the processing target wafers 200 are arranged and prorated in the order shown in job creation (order of priority acquired at S400) at S416. The result is stored in areas corresponding to the material processing order 1 and the material processing order 2 in the storage part 121c at S417. Specially, the processing order of the processing target wafers 200 is determined in an order of the number of the process modules PM, in an order of the number of the carries 110 or in an order of the number of the slots.

When uniform distribution on a carrier basis is set at S418, carrier combinations of a pattern of (2N □2)/2 (N: carrier number) are calculated at S419. Combinations whose maximum value is equal to or greater than the total number in the calculated combinations are extracted at S420, and a combination with the smallest difference of the prorated values is selected at S421. The result is stored in areas corresponding to the material processing order "1" and the material processing order "2" in the storage part 121c at S417.

In this way, when the maximum number of the processing target wafers of the process module PM1 (or PM) is equal to or greater than the total number of the processing target wafers, the control part 121 is configured to transfer all the processing target wafers 200 to the process module PM1 (or PM2) for processing. Specially, the total number of the processing target wafers is smaller than the maximum accommodation number of wafers (25 wafers in the present embodiment) in the carrier 110, it is desirable to transfer all the processing target wafers 200 to the process module PM1 (or PM2) for processing.

When the maximum number of the processing target wafers of the process module PM1 (or PM) is smaller than the total number of the processing target wafers, the control part 121 is configured to distribute and transfer the wafers to the process modules PM1 and PM2 and perform the process twice.

(Job Executing Process)

Figure 10A:
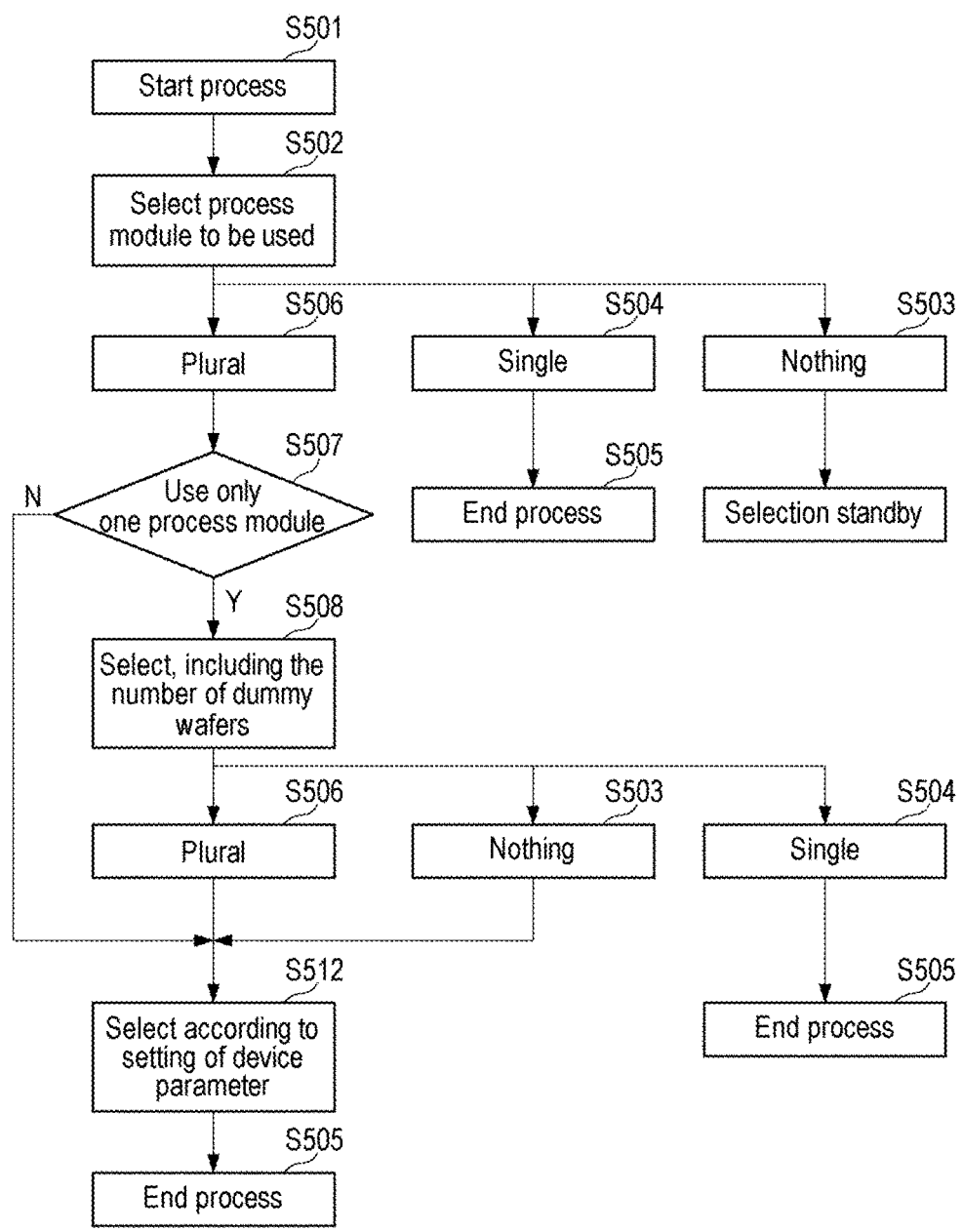
FIG. 10A is a diagram showing a process module determination flow according to the embodiments of the present disclosure.

At S500, after registration (creation) of the job, the control part 121 monitors the presence or absence of a job execution instruction periodically (every one second in the present embodiment). At S501, upon receiving the job execution instruction from a host controller or the operation part 124, the control part 121 is configured to start a process module selecting process shown in FIG. 10A.

At S502, the control part 121 picks up a usable process module PM. The conditions of this pickup are not an execution prohibition state of the process modules PM but a material processing standby state.

If there is no picked-up process module PM at S503, the control part 121 becomes a standby state (selection standby state) as it is. In a case of one picked-up process module at S504, the control part 121 determines the selection of a usable process module PM and ends this process at S505.

In a case of a plurality of picked-up process modules PM at S506, the control part 121 checks whether to use only one process module PM at S507. In the case of "No" at S507, a usable process module PM is selected according to the maintenance item selection parameter shown in FIG. 6A, and this process is ended at S512. In addition, the selection of the usable process module PM at S512 will be described later. On the other hand, in the case of "Yes" at S507, the pickup of the process module is performed again, including the number of dummy wafers at S508.

In a case where there is a plurality of picked-up process modules PM at S506 or nothing at S503, the control part 121 selects a usable process module PM to be described later, at S512, and ends this process at S505. If there is only one picked-up process module PM at S504, the control part 121 determines the selection of a usable process module PM and ends this process at S505.

Figure 10B:
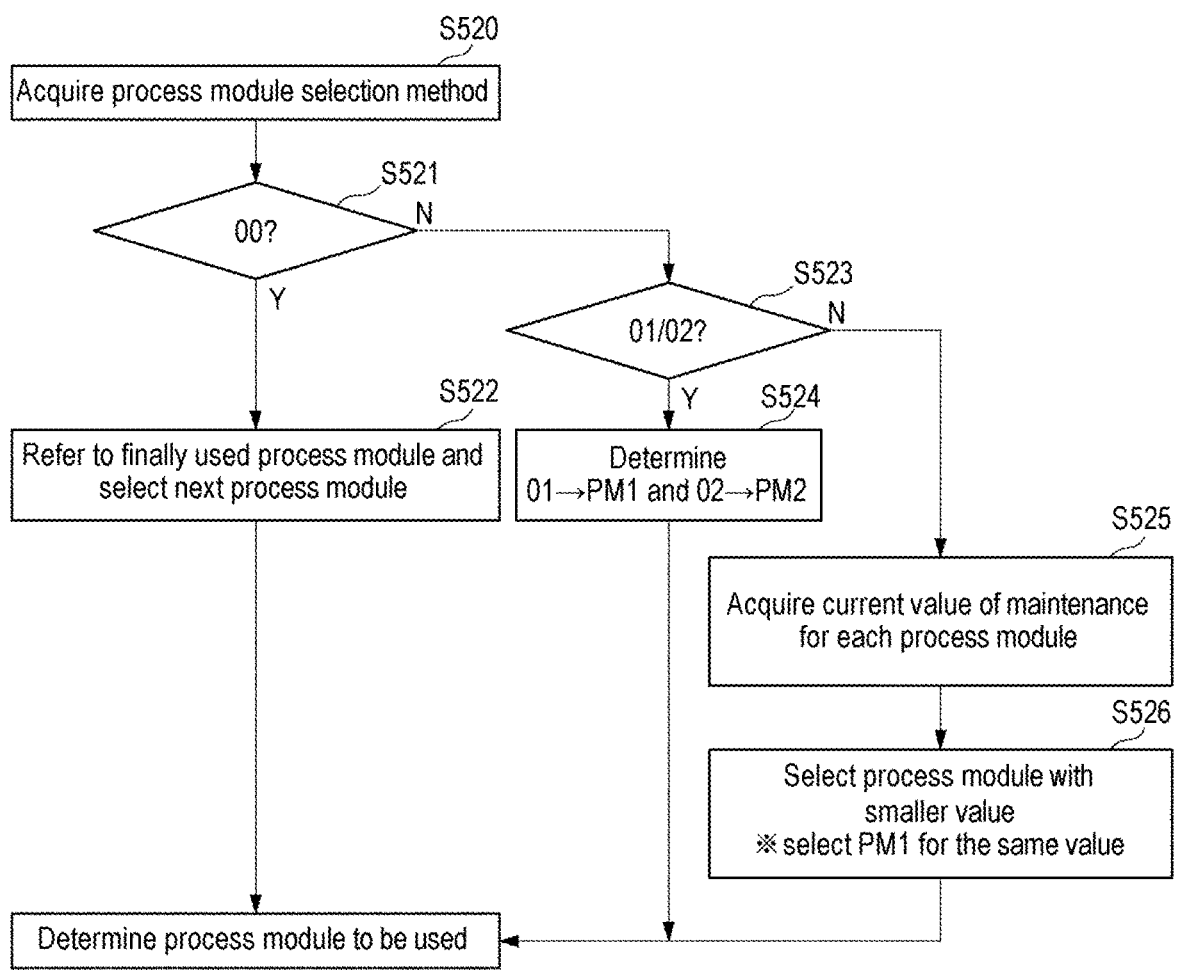
FIG. 10B is a diagram showing a process module determination flow according to the embodiments of the present disclosure.

A flow for selecting a process module PM at S512 is shown in FIG. 10B. At S520, the control part 121 acquires a process module PM selection method from the device parameter (maintenance item selection parameter) shown in FIG. 6A stored in advance in the storage part 121c. Specifically, a maintenance number defined in the maintenance item is acquired.

At S521, the control part 121 checks whether or not the maintenance number is "00". In the case of "Yes", at S522, the control part 121 refers to a lastly used process module PM, select a process module PM other than this process module PM and determine a process module to be used. In the case of "No", it is checked whether the maintenance number is "01" or "02" at S523.

When the maintenance number is "01" or "02", the control part 121 selects the process module PM1 in case of "01" and determines the process module to be used. The control part 121 selects the process module PM2 in case of "02" and determines the process module to be used at S524.

When the maintenance number is not "01" or "02", the control part 121 acquires the current value of the maintenance item of each process module at S525, and selects a process module with the smaller current value and determines a process module to be used at S526. When the current values are the same, the process module PM1 is selected and a process module to be used is determined.

If the process module PM (PM1) to be used is determined, then the control part 121 forms a batch group. Here, the batch group is a lump of processing target wafers 200, which can be processed in one process module PM one time, and basically refers to the processing target wafers 200. Here, the batch group corresponds to data of the material processing order "1" in the storage part 121c. By this, the batch group of the processing target wafers, which is processed in the process module PM1, is created.

Since portions, which are not capable of holding heat equalization, exist a little in both end portions (upper end portion and lower end portion) of the entire slots (substrate holding region) of the boat 217 inserted into the process module PM, several dummy wafers 200 are always held in those portions (slots) and product wafers 200 are held in holding parts of the slots where temperature is stable.

That is, the batch group is configured to include the dummy wafers 200 in order to arrange the dummy wafers 200 in the substrate holding region in which the heat equalization cannot be held.

Figure 11A:
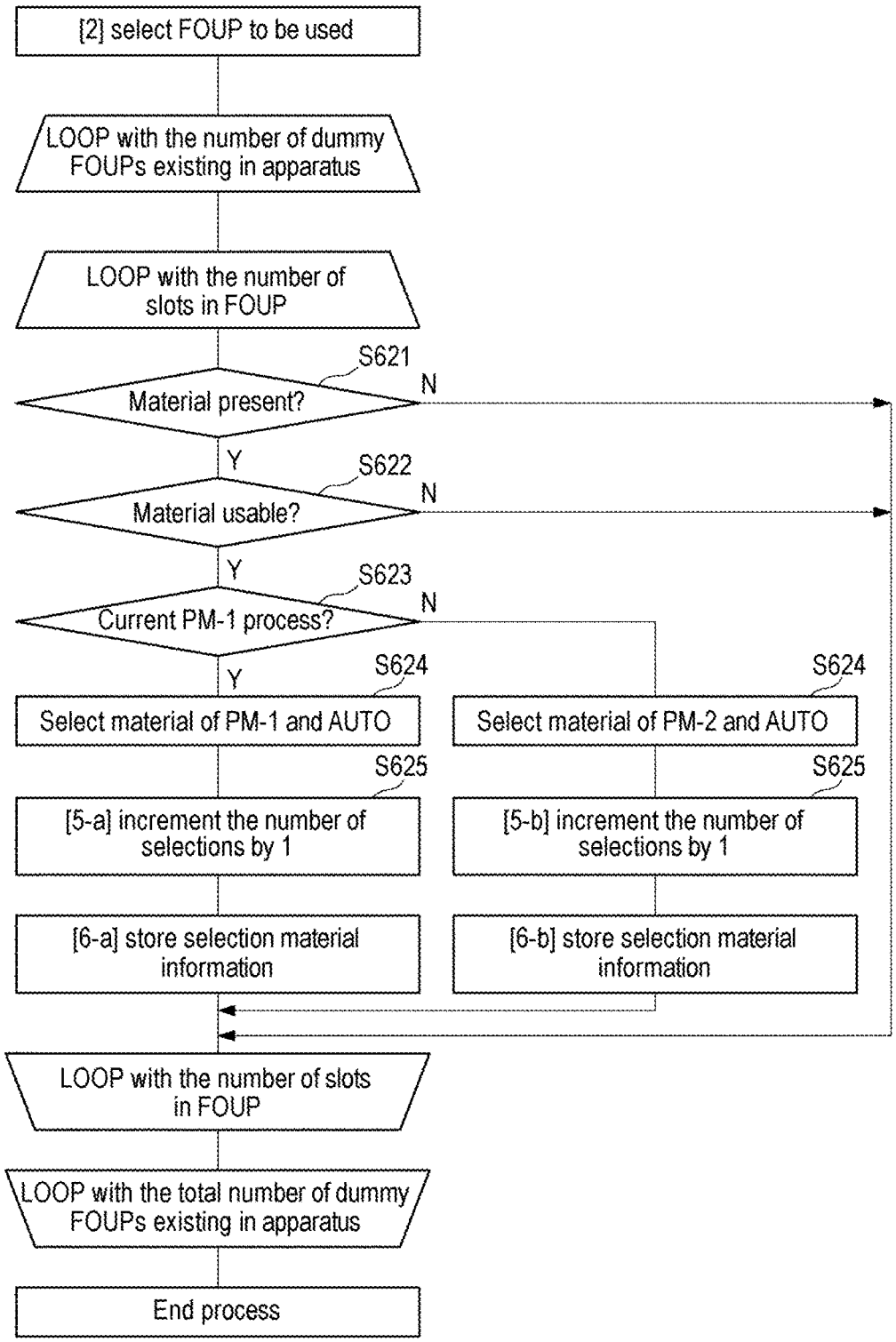
FIG. 11A is a diagram showing a use target carrier selecting process according to the embodiments of the present disclosure.

Next, selection of the carrier 110 of the dummy wafers 200 to be used and selection of the dummy wafers 200 are performed. A process that the control part 121 selects the carrier 110 of the dummy wafers 200 and selecting the dummy wafers 200 will be described by referring to FIG. 11A.

At S621, based on the carrier information, a carrier 110 using the dummy wafers 200 is picked up. It is determined whether or not a dummy wafer 200 is present in the slot number "1" in the picked-up carrier 110. If not present, it is determined whether or not the next dummy wafer 200 is present in the slot number "2."

At S622, when the dummy wafer 200 is present in the slot number "1" in the carrier 110, it is determined whether or not the dummy wafer 200 can be used. When the dummy wafer 200 cannot be used, it is determined whether or not a dummy wafer 200 is present in the next slot number "2".

At S623, when the dummy wafer 200 can be used in the slot number "1", it is determined whether to execute the current process in the process module PM1. If "Yes", the process module PM1 or the dummy wafer 200 designated with "AUTO" is selected from the wafer information of the dummy wafer 200. If "No", the process module PM2 or the dummy wafer 200 designated with "AUTO" is selected.

At S624, 1 is added to the number of selection (default is 0), At S625, the wafer information of this dummy wafer 200 is stored, and it is determined whether or not a dummy wafer 200 is present in the next slot number "2". Then, the steps from S622 to S625 are executed by the number of slot numbers.

Thereafter, for the next dummy carrier (carrier storing the dummy wafer 200) 110, the steps from S622 to S625 are executed by the number of slot numbers. Then, when the wafer information for all the dummy wafers 200 is stored in the storage part 121c by the number of dummy carriers 110 picked-up at S621, this processing flow is ended.

In addition, the control part 121 checks whether the number of the wafers constituting the batch group including the dummy wafers 200 is sufficiently present.

At S600, subsequently, the control part 121 is configured to execute a sequence recipe including three steps of pre-processing (standby step), present processing (main step) and post-processing (end step). In the pre-processing, the transfer of the wafers 200 from the carrier 100 to the boat 217 is performed. The control part 121 creates substrate transfer parameters according to substrate arrangement defined as the material processing order "1" and the material processing order "2" in the storage part 121c and also using selection material information of the dummy wafers 200, which is stored in the storage part 121c, and various types of wafers 200 are transferred to the boat 217 installed below the sequential process modules (PM). Here, the control part 121 selects the dummy wafers 200 to be finally used and determines an order thereof to be transferred.

Figure 11B:
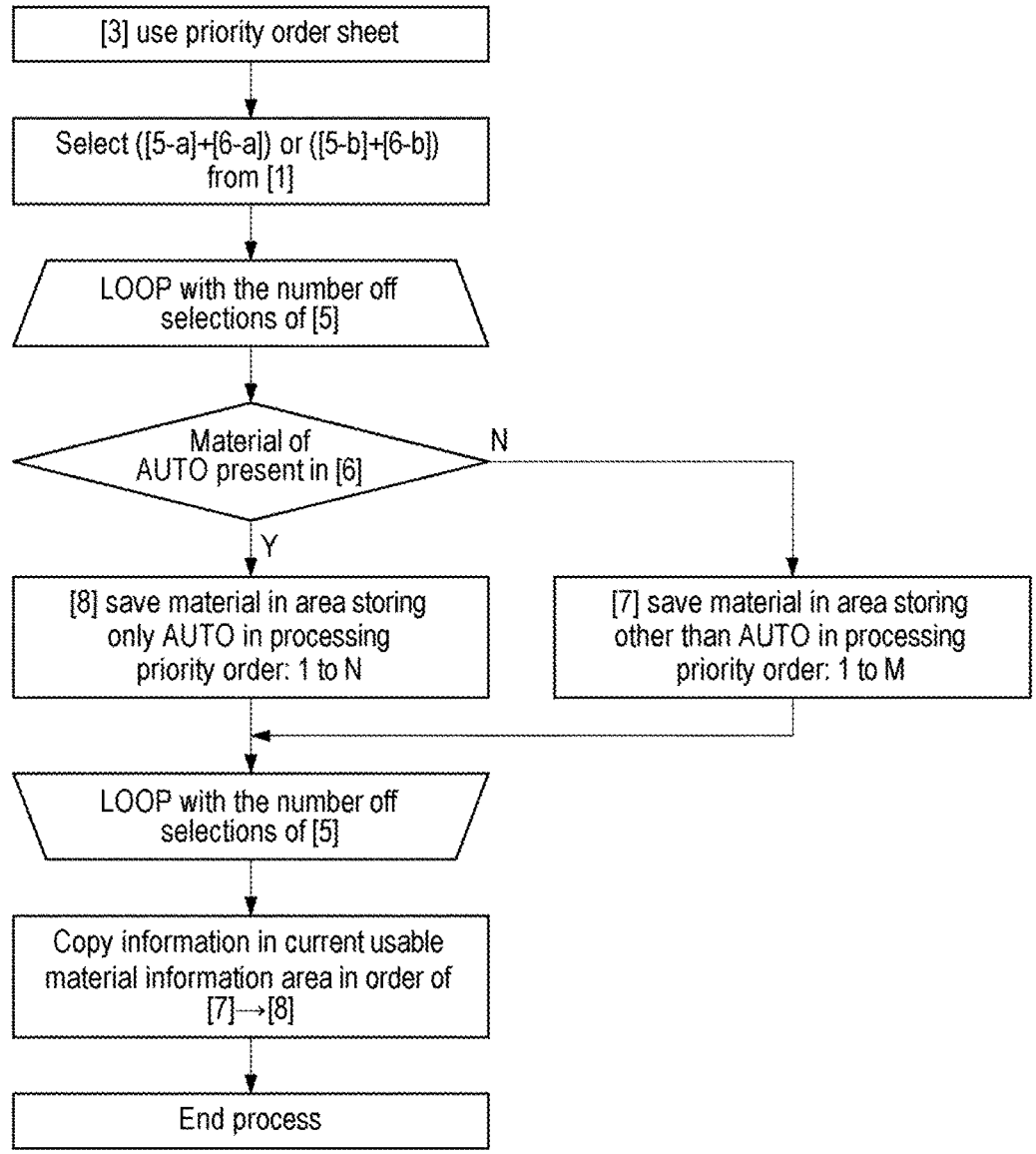
FIG. 11B is a diagram showing a use priority sorting process according to the embodiments of the present disclosure.

Next, a process of prioritizing and sorting the dummy wafers 200 in S612 in the order of use will be described with reference to FIG. 11B.

The control part 121 acquires the selection material information stored in the storage part 121c according to the information of the processing target process module PM and determines whether or not the dummy wafer 200 is a dummy wafer 200 designated with "AUTO", based on the acquired selection material information. The control part 121 stores the dummy wafer 200 in an AUTO area in which only the dummy wafer 200 designated with "AUTO" is stored and in a PM designation area in which the dummy wafer 200 designated with other than "AUTO". When the process of storage in the AUTO area and the PM designation area is completed by the number of selections acquired with the selection material information, the dummy wafer 200 stored in the PM designation area is stored in the currently usable material information area so as to be an order used before the dummy wafer 200 stored in the AUTO area.

In this way, according to the present embodiments, by using the dummy wafers 200 dedicated to a specific process module and using the dummy wafers 200 sharing the process modules whenever there is a shortage, it is possible to efficiently operate the dummy wafers 200. Therefore, the dummy wafers 200 to be used can be efficiently used to perform material processing in the substrate processing apparatus 10. Further, in order to facilitate the exchange of the dummy wafers 200, a specific dummy wafer 200 is used, so that it makes easy to exchange the carrier 110 accommodating the dummy wafers 200. Here again, the dummy wafers 200 include both side dummy wafers and supplementary dummy wafers.

FIG. 12A shows an example of a substrate transfer parameter. Substrate transfer data include information indicating the order in which the various wafers 200 are processed, transfer source information of various wafers 200 mounted on the boat 217, and transfer destination information indicating the process chamber 201 for processing the various substrates 200.

The substrate transfer parameter includes information indicating the type and item number of the carrier 110 in which various wafers 200 mounted on the boat 217 are stored, as the transfer source information, and information indicating a slot number in the carrier 110 on which the various wafers 200 are mounted. The substrate transfer parameter includes information indicating the slot number of the boat 217, as transfer destination information.

Next, the preparation of the transfer parameters shown in FIG. 12A will be described by referring to FIG. 13. Specifically, arrangement of the wafers 200 on the boat 217 for transferring the wafers 200 to the boat 217 relating to the selected process module PM1 is set at S611. At S621, the control part 121 determines an order for transferring the wafers from the arrangement of the wafers 200 obtained at S611. At S613, the control part 121 determines an order for delivering the carrier 110 of the wafers 200 based on the transfer order of the wafer 200.

At S611, since the heat equalization cannot be held at both end portions (upper end portion and lower end portion) of the entire slots (substrate holding region) of the boat 317, the product wafers 200 cannot be mounted thereon. Thus, the dummy wafers 200 are arranged on the portions where the heat equalization cannot be held. Specifically, the control part 121 arranges the dummy wafers on the both end portions (slots up to the second slot from the top in the upper end portion, and slots up to the third slot from the bottom in the lower end portion) in which the heat equalization cannot be held among the entire slots (46 slots in FIG. 12). In addition, the control part 121 is configured to arrange the monitor wafers on three places of a center portion (24th slot) and slots (4th slot and 44th slot) holding the heat equalization at boundaries with the both end portions. Finally, the control part 121 sets the product wafers 200 to be arranged on the slots other than the slots of the dummy wafers 200 and the monitor wafers 200.

At S612, the control part 121 determines an order for transferring the wafers 200 from the arrangement of the wafers 200 based on information on the carrier 110 of various types of wafers 200 up to now. Specifically, the dummy wafers 200 are first transferred to the boat 217 to prevent particles when transferring the wafers 200. Next, a transfer order (denoted as transfer priority in FIG. 12A) for transferring the product wafers 200 and the monitor wafers 200 is determined. In addition, in FIG. 12A, the transfer order is determined such that the monitor wafers 200 are transferred after the product wafers 200 are transferred, That is, it is determined such that the dummy wafers 200, the product wafers 200 and the monitor wafers 200 are transferred to the boat 217 in this order.

In addition, the control part 121 appropriately determines an order of the slot numbers to be extracted inside the carrier 110 by being associated with the transfer order (transfer priority). Further, in the embodiments, the orders of the target wafers 200 and the dummy wafers 200, which are extracted inside the carrier 110, are the slot numbers, respectively.

At S613, the control part 121 determines an order of each carrier 110 transferred to the pod opener 21 based on the orders of various types of wafers 200. Here, it is determined such that a carrier (D01) 110 is first mounted on the pod opener 21, a carrier (P01) 110 and a carrier (P02) 110 are mounted on the pod opener 21 in this order, and the carrier (D01) 110 is finally mounted on the pod opener 21.

Next, when a transfer instruction of the wafers 200 to the boat 217 is received from an arbitrary step in the process recipe, the control part 121 reads the created transfer parameters to transfer the dummy wafers 200 to corresponding slots except for the heat equalization region among the slots in the boat 217 and to transfer the product wafers 200 and the monitor wafers 200 to remaining slots corresponding to the heat equalization region in the boat 217 by moving the wafer transfer mechanism 125.

The control part 121 performs a transfer of the carrier 110 and the wafers 200 to the pod transfer device 130 and the wafer transfer mechanism 125. Specifically, the carrier (D01) 110 is first mounted on the pod opener 21 by the pod transfer device 130 and the dummy wafers are transferred to the boat 217 in the transfer order (transfer priority). Subsequently, the carrier (P01) 110 and the carrier (P02) 110 are mounted on the pod opener 21 in this order, and the product wafers 200 are transferred to the boat 217 in the transfer order (transfer priority) by the wafer transfer mechanism 125. Finally, the carrier (D01) 110 is mounted on the pod opener 21 by the pod transfer device 130, and the monitor wafers 200 are transferred to the boat 217 in the transfer order (transfer priority) by the wafer transfer mechanism 125.

Here, if two carriers 110 can be mounted on the pod opener 21 and the carrier (P01) 110 and the carrier (M01) 110 are mounted thereon, the transfer order can be successively determined without being divided into the product wafers 200 and the monitor wafers 200, so that the transfer time can be reduced. In addition, if the monitor wafers 200 and the product wafers 200 can be placed in the carrier 110 with being mixed, the transfer order can be also successively determined without being divided into the product wafers 200 and the monitor wafers 200, so that the transfer time can be reduced.

When the transfer of the wafers to the boat 217 is completed, confirmation of the transfer locations of the wafers 200 is performed. If not, the process recipe defined in the sequence recipe is executed. The control part 121 executes the process recipe to thereby perform the substrate processing process described above.

In addition, a process with respect to the process module PM2 is the same as the process in the process module PM1. Here, since the priority in the transfer order is given to the process module PM1, the order for processing the processing target wafer 200 starts from "47". Similarly, for the slot number of each carrier, it starts from "14" of the product carrier (P02) 110, starts from "4" of the monitor carrier (M01) 110 and starts from "6" of the dummy carrier (D01) 110. However, the slot number of the dummy carrier (DO1) 110 is appropriately determined according to the use priority sorting result shown in FIG. 11B.

(The Other Embedment)

Figures 12B, 13:
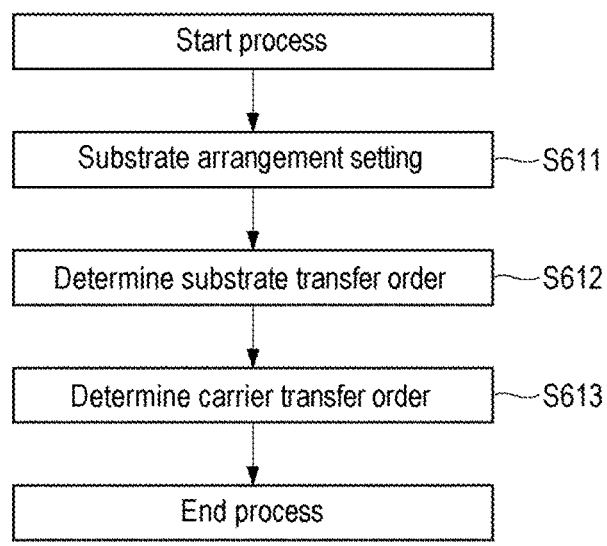

FIG. 12B shows an example of a substrate transfer parameter of the other embodiment. This substrate transfer parameter indicates a material processing order "1" and a material processing order "2" stored in the storage part 121c. That is, this is the substrate transfer parameter not having the dummy wafers and represents the same number as the number of the product wafers of FIG. 12A. Similarly, the substrate transfer parameter includes information indicating the order to for processing the processing target wafers 200, information indicating the carriers 110 storing the processing target wafers 200 and information indicating the slot numbers on which the wafers 200 are mounted in the carrier 110.

Since the dummy wafers are not used differently from the present embodiment, that is, the product wafers 200 are only used, time for transferring the wafers to the boat 217 is reduced. In addition, since it is not necessary to inject the dummy wafers 200 into the substrate processing apparatus 10, one contamination source is disappeared, so that the interior of the substrate processing apparatus can be held in a clean state.

In the above embodiments, during loading of the wafers onto the boat 217 by the wafer transfer mechanism 125 on one (left or right) mounting table 122, another pod 110 is transferred and mounted on the other (left or right) mounting table 122 from the pod shelf 105 by the pod transfer device 130 and, at the same time, the pod 110 is opened by the pod opener 21.

An example of forming a thin film using a substrate processing apparatus having a hot wall type process furnace has been described in the above embodiments. However, the present disclosure is not limited thereto but may be suitably applied to a case where a thin film is formed using a substrate processing apparatus having a cold wall type process furnace.

Further, the present disclosure is not limited to a semiconductor manufacturing apparatus for processing a semiconductor wafer, such as the substrate processing apparatus according to the present embodiments, but may also be applied to an LCD (Liquid Crystal Display) manufacturing apparatus for processing a glass substrate.

According to the present disclosure in some embodiments, it is possible to provide a substrate processing apparatus including a plurality of process modules, which is capable of coping with production of a relatively small lot.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a transfer mechanism for loading a plurality of substrates into a boat that is configured to hold the plurality of substrates including a product substrate and a dummy substrate;
a storage device configured to store a device parameter that includes at least a number of substrates that can be loaded on the boat, and a number of product substrates to be loaded on the boat; and
a controller configured to:
(1) generate substrate transfer data for transferring the plurality of substrates which includes: determining an order for loading each of the plurality of substrates into the boat, obtaining transfer source information of the plurality of substrates mounted on the boat, and determining a transfer destination for each of the plurality of substrates according to the device parameter, wherein the transfer destination is a process chamber;
(2) reading the generated substrate transfer data; and
(3) causing the transfer mechanism to transfer the plurality of substrates to the boat based on the read substrate transfer data, wherein the transfer mechanism is configured to: transfer the product substrate to a heat equalization region of an entire substrate holding region in the boat, and transfer the dummy substrate to a remaining substrate holding region of the entire substrate holding region in the boat.

2. The substrate processing apparatus of claim 1, wherein the substrate transfer data includes information indicating a pod in which the product substrate or the dummy substrate mounted on the boat is stored, as the transfer source information, and information indicating a slot number in the pod on which the product substrate or the dummy substrate is mounted.

3. The substrate processing apparatus of claim 1, wherein the plurality of substrates further includes a monitor substrate, and
wherein the transfer mechanism is further configured to transfer the monitor substrate after transferring the product substrate.

4. The substrate processing apparatus of claim 1, wherein, when the number of product substrates loaded on the boat is set to be equal to or smaller than the number of substrates that can be mounted on the boat, the controller generates the substrate transfer data so as to transfer the plurality of substrates to one process chamber selected from a plurality of process chambers.

5. The substrate processing apparatus of claim 1, wherein, when the number of product substrates loaded on the boat is set to be larger than the number of substrates that can be loaded on the boat, the controller generates the substrate transfer data so as to distribute the plurality of substrates according to a predetermined basis, and transfer the plurality of substrates to each of a plurality of process chambers.

6. The substrate processing apparatus of claim 2, wherein, when the number of product substrates loaded on the boat is set to be larger than the number of substrates that can be loaded on the pod, the controller generates the substrate transfer data so as to distribute the plurality of substrates according to a predetermined basis, and transfer the plurality of substrates to each of a plurality of process chambers.

7. The substrate processing apparatus of claim 2, wherein, when the number of product substrates loaded on the boat is set to be equal to or smaller than the number of substrates that can be loaded on the pod, the controller generates the substrate transfer data so as to transfer the plurality of substrates to one process chamber selected from a plurality of process chambers.

8. The substrate processing apparatus of claim 1, wherein the device parameter comprises maintenance items and maintenance numbers corresponding to the maintenance items, and
 wherein the controller is further configured to compare current values for a plurality of process chambers, which correspond to the maintenance numbers for the maintenance items, and determine an order of the plurality of process chambers for transferring the plurality of substrates.

9. The substrate processing apparatus of claim 2,
 wherein the controller is further configured to acquire the device parameter when the pod is input to the apparatus, and determine a process chamber in which the substrate stored in the pod is processed according to an injection operation.

10. The substrate processing apparatus of claim 1, wherein the device parameter comprises a login parameter for setting a usable process chamber for each login user, or a pod parameter for setting a usable process chamber for each pod type, and
 wherein the controller is further configured to determine a process chamber for transferring various substrates according to the login parameter when types of films to be processed on the product substrate are different for each of a plurality of process chambers, and determine the process chamber for transferring various substrates according to the pod parameter when the types of films to be processed on the product substrate are the same for the plurality of process chambers.

11. The substrate processing apparatus of claim 10, further comprising:
 an operation part having a setting screen for setting the login parameter,
 wherein the is operation part further has a setting screen configured to set the types and the number of pods to be used, and
 wherein the controller is configured to set a pod used for processing by the operation part, and display the set pod on the setting screen.

12. The substrate processing apparatus of claim 1, wherein the number of product substrates is 25 or more and 75 or less.

13. A non-transitory computer-readable recording medium storing a program that is executed in a substrate processing apparatus, that includes: a transfer mechanism for loading a plurality of substrates into a boat that is configured to hold the plurality of substrates, including a product substrate and a dummy substrate, a storage device configured to store a device parameter, that includes: at least a number of substrates that can be loaded on the boat, and a number of product substrates to be loaded on the boat, and a controller configured to cause the transfer mechanism to transfer the plurality of substrates to the boat, wherein the program causes the controller to perform:
 (1) generating substrate transfer data for transferring the plurality of substrates which includes: determining an order for loading each of the plurality of substrates into the boat, obtaining transfer source information of the plurality of substrates mounted on the boat, and determining a transfer destination for each of the plurality of substrates according to the device parameter, wherein the transfer destination is a process chamber;
 (2) reading the generated substrate transfer data; and
 (3) causing the transfer mechanism to transfer the plurality of substrates to the boat based on the read substrate transfer data,
 wherein the transfer mechanism is configured to: transfer the product substrate to a heat equalization region of an entire substrate holding region in the boat, and transfer the dummy substrate to a remaining substrate holding region of the entire substrate holding region in the boat.

* * * * *